United States Patent [19]

Maki

[11] Patent Number: 5,726,486
[45] Date of Patent: Mar. 10, 1998

[54] SEMICONDUCTOR DEVICE HAVING A BIPOLAR TRANSISTOR

[75] Inventor: Yukio Maki, Hyogo, Japan

[73] Assignee: Mitsubishi Denki Kabushiki Kaisha, Tokyo, Japan

[21] Appl. No.: 856,747

[22] Filed: May 15, 1997

Related U.S. Application Data

[63] Continuation of Ser. No. 529,900, Sep. 18, 1995, abandoned.

[30] Foreign Application Priority Data

Oct. 4, 1994 [JP] Japan ................. 6-239876

[51] Int. Cl.$^6$ ............. H01L 27/082; H01L 29/76; H01L 29/94; H01L 31/062
[52] U.S. Cl. ............. 257/593; 257/370; 257/371; 257/378
[58] Field of Search .............. 257/370, 378, 257/386, 371, 372, 373, 376

[56] References Cited

U.S. PATENT DOCUMENTS

| | | | |
|---|---|---|---|
| 4,868,135 | 9/1989 | Ogura et al. | 257/370 |
| 4,887,145 | 12/1989 | Washio et al. | 257/593 |
| 5,321,301 | 6/1994 | Sato et al. | 257/592 |

FOREIGN PATENT DOCUMENTS

| | | |
|---|---|---|
| 2-181962 | of 0000 | Japan . |
| 3-12961 | of 0000 | Japan . |
| 4-180260 | of 0000 | Japan . |
| 60-113967 | of 0000 | Japan . |
| 63-232456 | of 0000 | Japan . |
| 63-232456 | 9/1988 | Japan . |

OTHER PUBLICATIONS

"A 1.0 um N-Well CMOS/Bipolar Technology For VLSI Cirsuits", Miyamoto et al., 1983 IEEE, pp. 63-66.

"High Performance 1.0 um N-Well CMOS /Bipolar Technology", Momose et al., 1983 Symposium On VLSI Technology, pp. 40-41.

Primary Examiner—Wael Fahmy
Attorney, Agent, or Firm—Lowe, Price, LeBlanc & Becker

[57] ABSTRACT

A semiconductor device allowing reduction in collector resistance can be obtained without complicating manufacturing processes. In the semiconductor device, a first impurity layer of a first conductivity type having an impurity concentration higher than that of first semiconductor region is provided such that substantially all the upper portion thereof is in contact with a lower surface of a first element isolation insulating film which is formed between a base layer and a collector extraction layer As a result, the first impurity layer serves as a current path, reducing collector resistance. In addition, the first impurity layer can be easily formed by ion implantation, so that manufacturing processes will not be complicated.

9 Claims, 19 Drawing Sheets

SEMICONDUCTOR DEVICE HAVING A BIPOLAR TRANSISTOR

This application is a continuation of application Ser. No. 08/529,900 filed Sep. 18, 1995 now abandoned.

BACKGROUND OF THE INVENTION

1. Field of the Invention

The present invention generally relates to semiconductor devices and manufacturing methods thereof, and more particularly, the present invention relates to a semiconductor device having a bipolar transistor and a manufacturing method thereof.

2. Description of the Background Art

FIG. 19 is a cross sectional view showing an example of a conventional semiconductor device including an n-p-n type bipolar transistor. Referring to FIG. 19, at a prescribed region of a main surface of a semiconductor substrate 19 an n buried layer 31 is formed for reducing collector resistance in this conventional device. An $n^-$ epitaxial layer 33 is formed on n buried layer 31 and semiconductor substrate 19. Element isolation oxide films 7 and 13 are formed with a prescribed distance therebetween at a main surface of $n^-$ epitaxial layer 33. A p type intrinsic base layer 4 is formed between element isolation oxide films 7 and 13 at the main surface of $n^-$ epitaxial layer 33. At a prescribed region of a main surface of intrinsic base layer 4, an n type emitter layer 2 is formed. A p type external base layer 3 is formed at the main surface of intrinsic base layer 4, spaced apart from emitter layer 2. At a position separated from intrinsic base layer 4 by element isolation oxide film 7, an n type collector extraction layer 34 is formed to reach $n^+$ buried layer 31.

FIGS. 20–22 are cross sectional views illustrating manufacturing processes for the conventional semiconductor device shown in FIG. 19. Referring to FIGS. 20–22, the process for manufacturing the conventional semiconductor device shown in FIG. 19 will be described below. First, $n^+$ buried layer 31 is formed at a prescribed region of the main surface of semiconductor substrate 19 as shown in FIG. 20. Referring to FIG. 21, $n^-$ epitaxial layer 33 is grown on $n^+$ buried layer 31 and semiconductor substrate 19. Element isolation oxide films 7 and 13 are formed by such method as LOCOS (Local Oxidation of Silicon) at a prescribed region of the main surface of $n^-$ epitaxial layer 33. Thereafter, n type collector extraction layer 34 is formed by ion implantation method or the like so as to reach $n^+$ buried layer 31. Intrinsic base layer 4, external base layer 3 and emitter layer 2 are then formed as shown in FIG. 19.

However, although the semiconductor device manufactured by such processes can reduce collector resistance by $n^+$ buried layer 31, it requires processes for forming $n^+$ buried layer 31 and $n^-$ epitaxial layer 33, thereby complicating manufacturing processes.

In order to solve this problem, a semiconductor device has been proposed as shown in FIG. 23 which can simplify manufacturing processes. Referring to FIG. 23, in this conventional semiconductor device, an n well 1 is formed at the main surface of semiconductor substrate 19, and intrinsic base layer 4, external base layer 3, emitter layer 2, a collector extraction layer 5, and element isolation oxide film 7 are formed at a main surface of n well 1.

FIGS. 24–29 are cross sectional views illustrating manufacturing processes for the conventional semiconductor device shown in FIG. 23. Manufacturing processes for the conventional semiconductor device shown in FIG. 23 will be described with reference to FIGS. 24–29.

Referring to FIG. 24, n well 1 is formed at the main surface of semiconductor substrate 19. Referring to FIG. 25, isolation oxide films 7 and 13 are formed at prescribed regions of the main surfaces of n well 1 and semiconductor substrate 19. A resist pattern 18 is then formed to cover a region other than a region where collector extraction layer 5 is to be formed, as shown in FIG. 26. Using resist pattern 18 as a mask, n type collector extraction layer 5 is formed by implanting ions of phosphorus or arsenic to n well 1 and resist 18 is then removed.

Referring to FIG. 27, a resist pattern 20 is formed to cover a region other than a region where external base layer 3 is to be formed. Using resist patter 20 as a mask, p type external base layer 3 is formed by implanting ions of $BF_2$ or boron (B) to the main surface of n well 1. Resist pattern 20 is removed thereafter. As shown in FIG. 28, a resist pattern 21 is then formed to cover a region other than a region where intrinsic base layer 4 is to be formed. Using resist pattern 21 as a mask, p type intrinsic base layer 4 is formed by implanting ions of B or $BF_2$ to the main surface of n well 1. Resist pattern 21 is removed thereafter.

Referring to FIG. 29, a resist pattern 22 is next formed to cover a region other than a region where emitter layer 2 is to be formed. The n type emitter layer 2 is formed by implanting ions of arsenic (As) to the main surface of intrinsic base layer 4 using resist pattern 22 as a mask, which is then removed. This process completes the conventional semiconductor device shown in FIG. 23. The manufacturing processes for the conventional semiconductor device in FIG. 23 allows omission of a step for forming $n^-$ epitaxial layer 33, compared to the manufacturing processes for the semiconductor device in FIG. 19, thereby simplifying the manufacturing processes.

In the conventional semiconductor device in FIG. 23, however, an increase in impurity concentration of n well 1 for reducing collector resistance undesirably results in an increase in that of an n well (not shown) for a PMOS transistor formed at the same time as n well 1. This leads to an increase in junction capacitance between a source/drain region of the PMOS transistor and the n well and between the n well and the semiconductor substrate. With the increase in impurity concentration, a substrate constant is also undesirably increased. Therefore, it is difficult to raise impurity concentration of n well 1 in the conventional semiconductor device shown in FIG. 23 and accordingly collector resistance reaches as high as several kilos of ohm, which is desirably 500Ω or less. Thus, it has been difficult to reduce collector resistance and simplify manufacturing processes at the same time. FIG. 30 shows an impurity profile along the line 101—101 of the conventional semiconductor device shown in FIG. 23.

SUMMARY OF THE INVENTION

One object of the present invention is to provide a semiconductor device allowing both simplification of manufacturing processes and reduction of collector resistance.

Another object of the present invention is to provide a manufacturing method of a semiconductor device which can simplify processes for manufacturing a semiconductor device having a reduced collector resistance.

A semiconductor device in accordance with one aspect of the present invention includes a first semiconductor region, a base layer, an emitter layer, a collector extraction layer, a first element isolation insulating film, and a first impurity layer. The first semiconductor region has a main surface and a first conductivity type. The base layer is formed at a prescribed region of the main surface of the first semiconductor region and has a second conductivity type. The emitter layer is formed at a prescribed region of the main surface of the base layer and has the first conductivity type. The collector extraction layer is formed at the main surface of the first semiconductor region with a prescribed distance from the base layer and has the first conductivity type. The first element isolation insulating film is formed between the collector extraction layer and the base layer at the main surface of the first semiconductor region. The first impurity layer is formed so that substantially all the upper portion thereof is in contact with a lower surface of the first element isolation insulting film, and has an impurity concentration higher than that of the first semiconductor region and the first conductivity type. Preferably, the semiconductor device further includes a second semiconductor region of the first conductivity type, a field effect transistor of the second conductivity type formed at a main surface of the second semiconductor region, a second element isolation insulating film formed to surround the field effect transistor, and a second impurity layer of the first conductivity type formed so that substantially all the upper portion thereof is in contact with a lower surface of the second element isolation insulating film, and the first and second impurity layers may have substantially the same impurity concentration.

In this semiconductor device, the first impurity layer of the first conductivity type having a higher impurity concentration than the first semiconductor region is formed in a manner that substantially all the upper portion thereof is in contact with the lower surface of the first element isolation insulating film formed between the base layer and the collector extraction layer, so that collector resistance can be reduced by the first impurity layer. Since the first impurity layer can be easily formed by ion implantation, collector resistance can be reduced while simplifying manufacturing processes. Preferably, the semiconductor device further includes the second semiconductor region, the field effect transistor of the second conductivity type, the second element isolation insulating film, and the second impurity layer serving as a channel stopper layer and formed so that substantially all the upper portion thereof is in contact with the lower surface of the second element isolation insulating film, whereby the first and second impurity layers can be formed simultaneously, further simplifying manufacturing processes.

The semiconductor device in accordance with another aspect of the present invention includes a first semiconductor region of a first conductivity type, a base layer of a second conductivity type, an emitter layer of the first conductivity type, a collector extraction layer of the first conductivity type, a first element isolation insulating film, and a first impurity layer. The first impurity layer is located at a prescribed depth from a lower surface of the base layer, extending substantially parallel thereto. The first impurity layer is formed in such a manner that a part of an upper portion thereof is in contact with a lower surface of the first element isolation insulating film, and has an impurity concentration higher than that of the first semiconductor region. A portion of the first impurity layer located under the first element isolation insulating film is shallower than the rest of the layer. Preferably, the base layer can be formed to have a junction depth shallower than the lower surface of the first element isolation insulating film. Preferably, the semiconductor device further includes a second semiconductor region, a field effect transistor of the second conductivity type formed on a main surface of the second semiconductor region, a second element isolation insulating film formed to surround the field effect transistor, and a second impurity layer. The second impurity layer can be formed so that it extends substantially in parallel to the main surface of the second semiconductor region below a region where the field effect transistor is to be formed and that a part of the upper portion thereof is in contact with a lower surface of the second element isolation insulating film. The second impurity layer also has a higher impurity concentration than the second semiconductor region and a part of the second impurity layer located below the second element isolation insulating film can be formed shallower than the rest of the layer.

In this semiconductor device, the first impurity layer of the first conductivity type is formed at a prescribed depth from the lower surface of the base layer, extending substantially in parallel to the base layer, having an upper portion partially in contact with the lower surface of the first element isolation insulating film, and having a higher impurity concentration than the first semiconductor region. As a result, collector resistance can be reduced by the first impurity layer. Since the first impurity layer can be easily formed by ion implantation, manufacturing processes can be simplified while achieving reduction in collector resistance. Preferably, the semiconductor device further includes a second semiconductor region of the first conductivity type, a field effect transistor of the second conductivity type, and a second element isolation insulating film formed to surround the field effect transistor. In addition, a second impurity layer of the first conductivity type serving as a channel stopper is formed in such a manner that substantially all the upper portion thereof is in contact with a lower surface of the second element isolation insulating film, so that the second impurity layer can be formed with the same step as the first impurity layer, further simplifying manufacturing processes.

A semiconductor device in accordance with a further aspect of the present invention includes a semiconductor substrate, a first well region of a first conductivity type, and a second well region of the first conductivity type. The first well region is formed at a main surface of the semiconductor substrate and has a bipolar transistor formed at the surface and a first impurity concentration. The second well region is formed at the main surface of the semiconductor substrate and has a field effect transistor formed at the surface and a second impurity concentration. The first impurity concentration of the first well region is set higher than the second impurity concentration of the second well region.

As a result, collector resistance of the bipolar transistor can be reduced without adversely affecting the characteristics of the field effect transistor.

A manufacturing method of a semiconductor device in accordance with a further aspect of the present invention is a method of manufacturing a semiconductor device in which a bipolar transistor is formed on a main surface of a first semiconductor region of a first conductivity type and an element isolation insulating film is formed between a collector extraction layer and a base layer of the bipolar transistor. According to this manufacturing method, ions of impurity are implanted to a region right under the element isolation insulating film, and form a first impurity layer of the first conductivity type having an upper portion substantially entirely in contact with a lower surface of the element isolation insulating film and also having an impurity concentration higher than that of the semiconductor region.

Consequently, a semiconductor device having a reduced collector resistance can be formed with simple manufacturing processes.

According to a manufacturing method of a semiconductor device in accordance with a further aspect of the present invention, ions of impurity are implanted into a semiconductor region to form a first impurity layer of a first conductivity type, having a higher impurity concentration than the semiconductor region, at a prescribed depth from a lower surface of a base layer, which impurity layer extends substantially in parallel to the base layer and has an upper portion partially in contact with a lower surface of an element isolation insulting film.

As a result, a semiconductor device having a low collector resistance can be manufactured with simple processes.

According to a manufacturing method of a semiconductor device in accordance with a still further aspect of the present invention, ions of impurity of a first conductivity type are implanted to a prescribed region of a main surface of a semiconductor region of a first conductivity type to bring the main surface of the semiconductor region into an amorphous state and form an emitter layer. By implanting ions of impurity of a second conductivity type into the region which is brought into an amorphous state, a base layer is formed under the emitter layer.

As a result, the base layer thus formed is made shallower, thereby preventing contact of the first impurity layer and the base layer when the first impurity layer is formed in accordance with the invention according to the immediately above further aspect. In addition, a thin base layer is formed, thereby achieving a high performance bipolar transistor.

A manufacturing method of a semiconductor device in accordance with a further aspect of the present invention is a method of manufacturing a semiconductor device in which a field effect transistor of a second conductivity type is formed at a first well region of a first conductivity type and a bipolar transistor is formed at a second well region of a first conductivity type. In accordance with this manufacturing method, ions of impurity of the second conductivity type are implanted into a region where the first well region is to be formed. By implanting ions of impurity of the first conductivity type into regions where first and second well regions are to be formed, the first region of the first conductivity type and the second well region of the first conductivity type having an impurity concentration higher than that of the first well region are formed. As a result, a semiconductor device which allows reduction in collector resistance of the bipolar transistor can be formed by simple processes without adversely affecting the characteristics of the field effect transistor.

The foregoing and other objects, features, aspects and advantages of the present invention will become more apparent from the following detailed description of present invention when taken in conjunction with the accompanying drawings.

DESCRIPTION OF THE PREFERRED EMBODIMENTS

Now, embodiments of the present invention will be described below with reference to the drawings.

Figure 1:
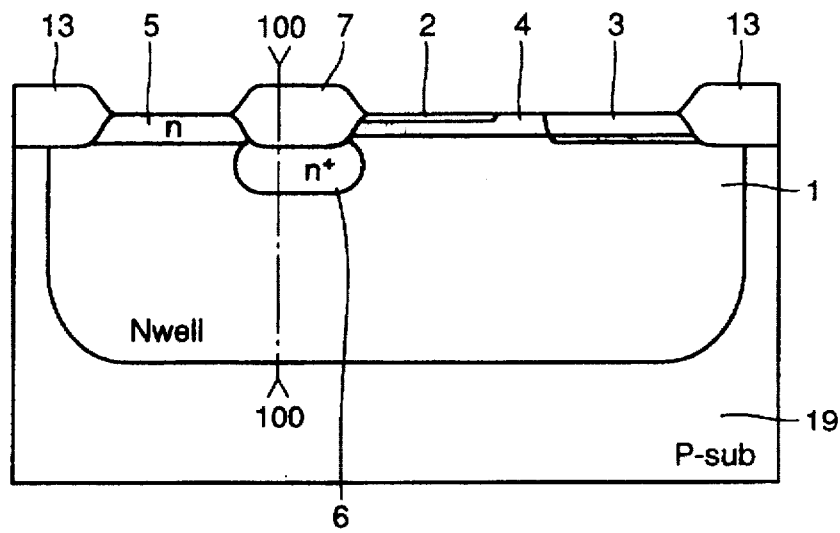
FIG. 1 is a cross sectional view showing a semiconductor device in accordance with a first embodiment of the present invention.
Figure 2:
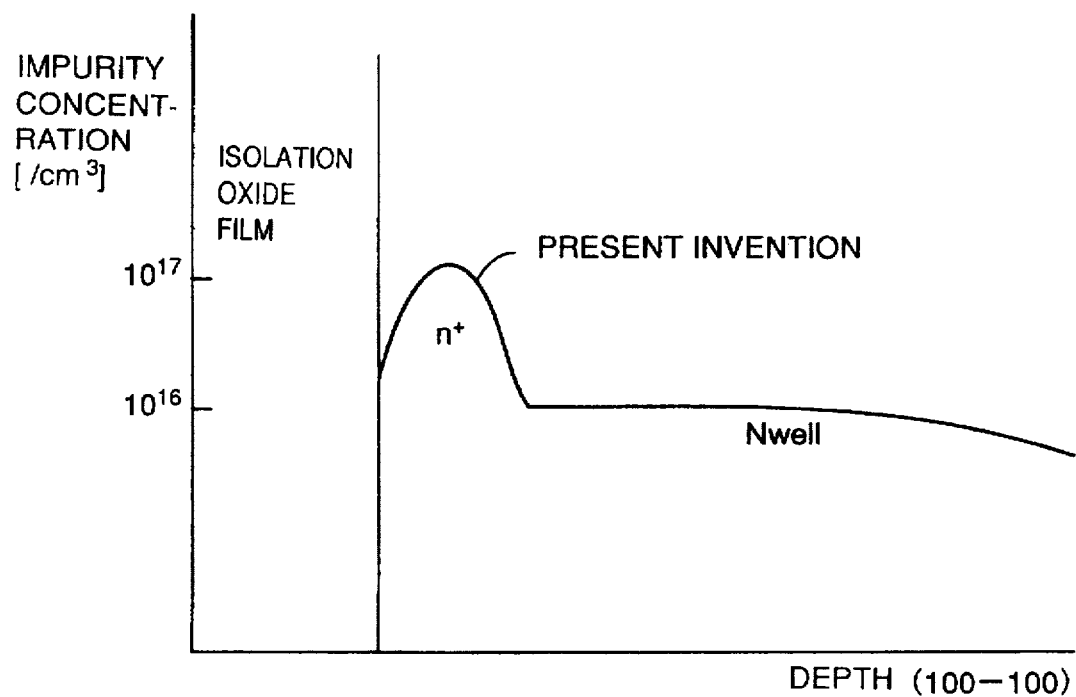
FIG. 2 shows an impurity profile along the line 100—100 of the semiconductor device shown in FIG. 1 in accordance with the first embodiment of the present invention.

Referring to FIG. 1, in a semiconductor device of this first embodiment, an n well 1 is formed at a main surface of a semiconductor substrate 19. At a main surface of n well 1, isolation oxide films 7 and 13 are formed with a prescribed distance therebetween. A p type intrinsic base layer 4 is formed at the main surface of n well 1, and an n type emitter layer 2 is formed at a main surface of intrinsic base layer 4. A p type external base layer 3 is formed with a prescribed distance from emitter layer 2. At a position separated from intrinsic base layer 4 by isolation oxide film 7, a collector extraction layer 5 is formed.

Here in this first embodiment, an $n^+$ layer 6 is formed immediately under isolation oxide film 7, which layer has an upper portion substantially entirely touching a lower surface of film 7 and has a higher impurity concentration than n well 1. This layer 6 serves to reduce collector resistance. In addition, n⁺ layer 6 can be formed easily by ion implantation as will be described later, and therefore the manufacturing process will not be complicated. Thus, a semiconductor device having a reduced collector resistance can be easily manufactured without complicating the manufacturing processes in this first embodiment.

Figure 3:
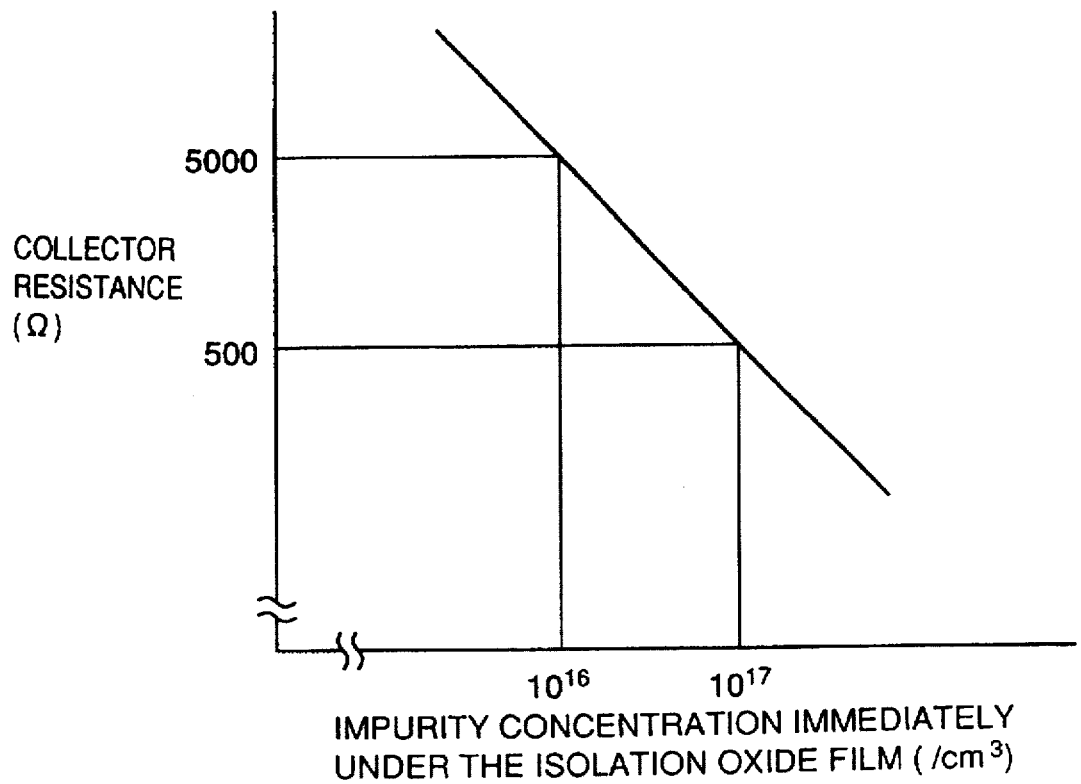
FIG. 3 shows a correlation between collector resistance and impurity concentration at a region immediately under the isolation oxide film.
Figure 4:
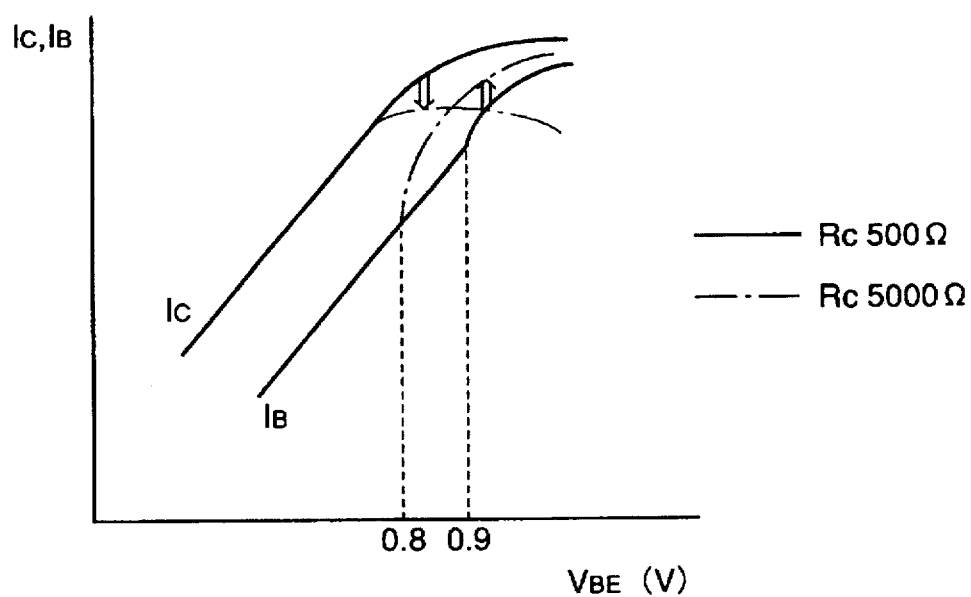
FIG. 4 shows a correlation between a base-emitter voltage $V_{BE}$ and a base current $I_B$ and a collector current $I_C$ when collector resistance is 500Ω and 5000Ω.

Next, the impurity concentration of n⁺ layer 6 will be considered. In practice, a bipolar transistor is utilized with base-emitter voltage ($V_{BE}$) of approximately 0.85 V. Accordingly, it is necessary to suppress degradation in performance of a bipolar transistor due to saturation when $V_{BE}$ is less than approximately 0.9 V. FIG. 3 shows a correlation between collector resistance and impurity concentration at a region immediately under the isolation oxide film, and FIG. 4 shows a correlation between base-emitter voltage $V_{BE}$ and collector current $I_C$ and base current $I_B$. Referring to FIG. 4, a parasitic p-n-p bipolar transistor formed by p type substrate 19, n well 1 and external base layer 3 turns on if collector resistance ($R_C$) is as high as approximately 5000Ω, thereby reducing collector current ($I_C$) of the designed n-p-n bipolar transistor. Since current flows through bases 3 and 4 of the n-p-n bipolar transistor, base current ($I_B$) increases, and this is the state shown in FIG. 4.

As can be seen from FIG. 4, the bipolar transistor is saturated with base-emitter voltage ($V_{BE}$) at 0.8 V when collector resistance ($R_C$) is approximately 5000Ω, while it is not saturated even with $V_{BE}$ at approximately 0.9 V when collector resistance ($R_C$) is about 500Ω. Therefore, collector resistance ($R_C$) is desirably about 500Ω or less. Referring to FIG. 3, impurity concentration of n⁺ layer 6 located immediately under the isolation oxide film must be $10^{17}/cm^3$ or higher so as suppress collector resistance ($R_C$) to the level of 500Ω or less. The impurity concentration of n⁺ layer 6 is required to be at least $10^{17}/cm^3$ in the first embodiment shown in FIG. 1.

Figure 5:
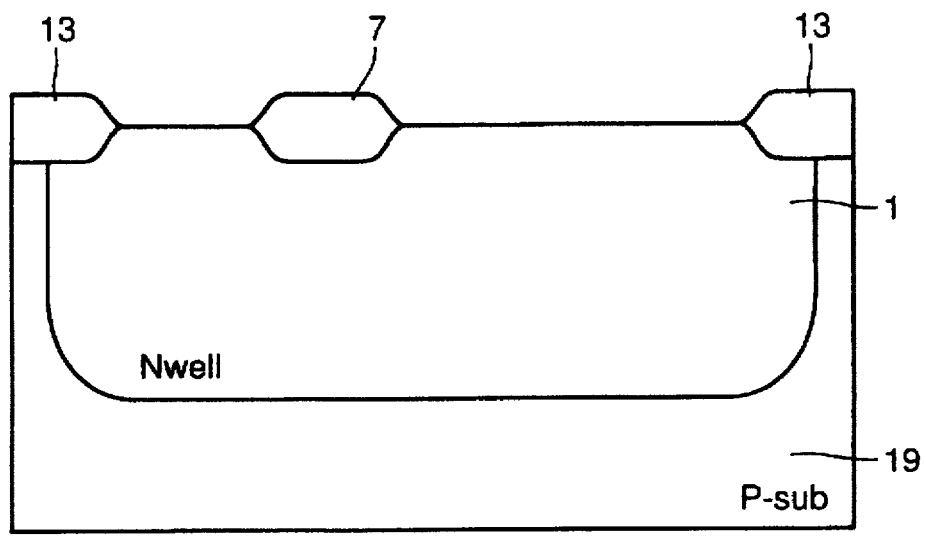
FIGS. 5 and 6 are cross sectional views showing first and second steps, respectively, of a process for forming an $n^+$ layer of the semiconductor device in FIG. 1 in accordance with the first embodiment.

Now, a method of forming n layer will be described below with reference to FIGS. 5 and 6. As shown in FIG. 5, n well 1 is formed at the main surface of p type semiconductor substrate 19 by thermal diffusion or ion implantation. Thereafter, isolation oxide films 7 and 13 having a thickness of approximately 2000–7000 Å are formed by LOCOS method or the like.

Figure 6:
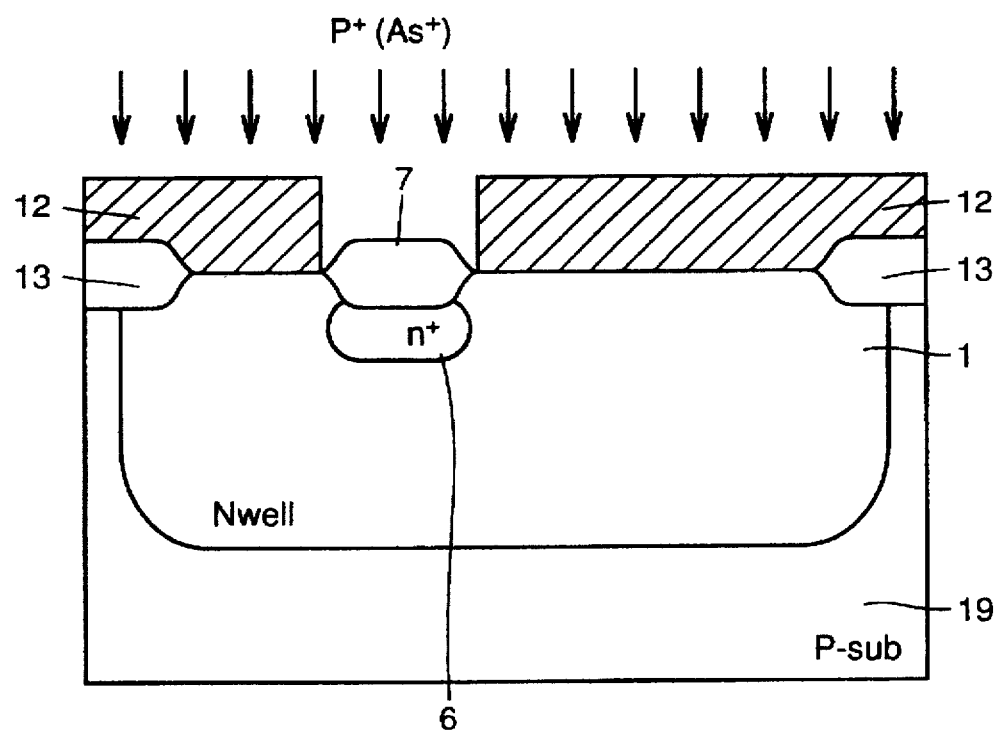

Referring to FIG. 6, a resist pattern 12 is formed to cover a region other than isolation oxide film 7. Using resist pattern 12 as a mask, ions of phosphorus are implanted with the impurity concentration of $1 \times 10^{12} - 1 \times 10^{14}/cm^2$ and the implantation energy of 200–600 keV. The implantation energy is preferably changed to correspond with the thickness of isolation oxide film 7. Thus, n⁺ layer 6 is formed immediately under isolation oxide film 7. When arsenic is used instead of phosphorus, ions thereof are implanted with the impurity concentration of $1 \times 10^{12} - 1 \times 10^{14}/cm^2$ and the implantation energy of 600–1200 keV. Resist pattern 12 is then removed. The n⁺ layer 6 of the first embodiment shown in FIG. 1 can thus be formed easily, and therefore in this first embodiment, a semiconductor device having low collector resistance can be easily formed without complicating manufacturing processes. Although n layer 6 is formed after isolation oxide film 7 in accordance with the manufacturing processes shown in FIGS. 5 and 6, n⁺ layer 6 can also be formed before isolation oxide film 7 is formed.

Figure 7:
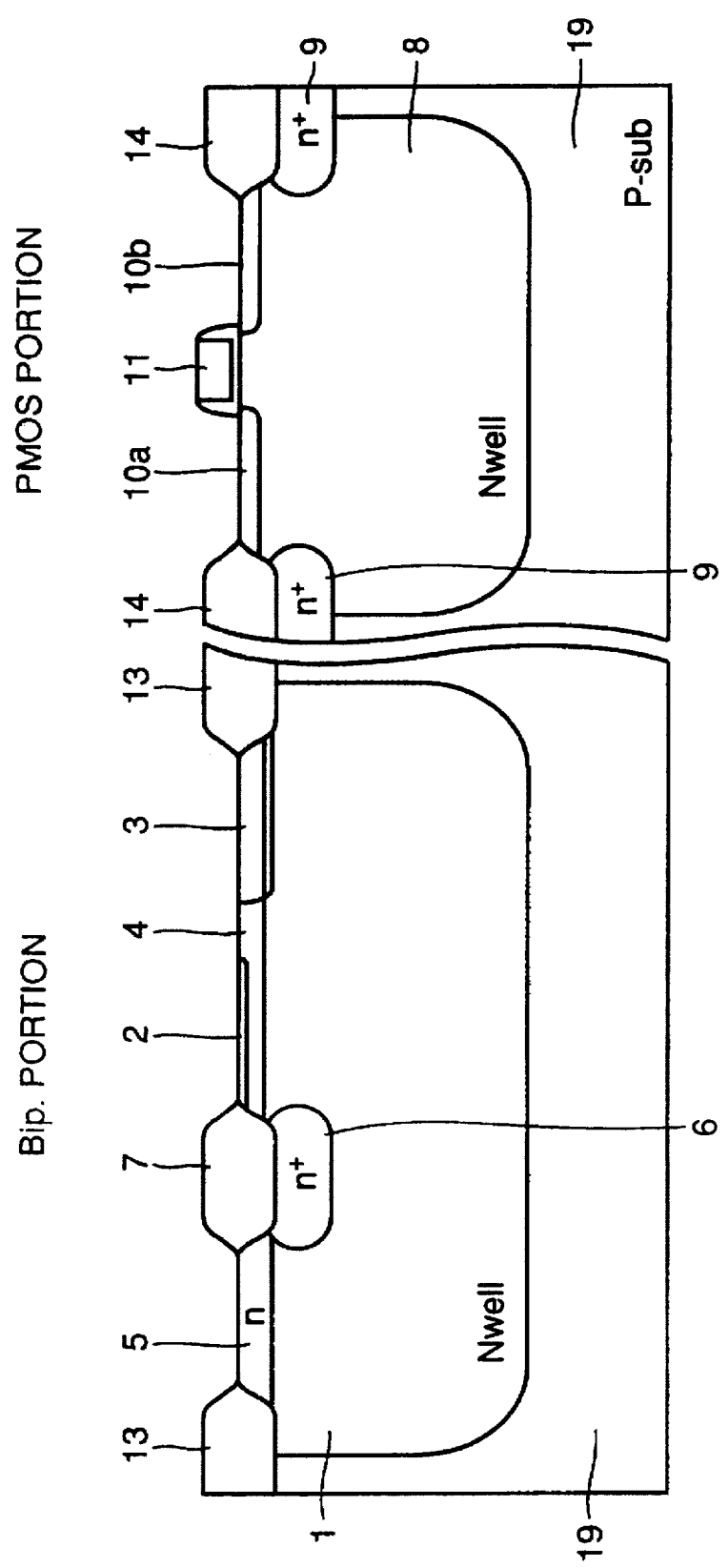
FIG. 7 is a cross sectional view showing an application of the semiconductor device in FIG. 1 in accordance with the first embodiment.

Referring to FIG. 7, in accordance with an application of the first embodiment, n⁺ layer 6 is formed at the same time as n⁺ layer 9 serving as a channel cut layer (implantation layer for element isolation) of a PMOS transistor portion. This makes it possible to manufacture a semiconductor device having reduced collector resistance without increasing manufacturing processes. As shown in FIG. 7, an n well 8 is formed at the main surface of semiconductor substrate 19 at the PMOS transistor portion. At the main surface of n well 8, p type source/drain regions 10a and 10b are formed with a prescribed distance therebetween. A gate electrode 11 is formed between source/drain regions 10a and 10b. An isolation oxide film 14 is formed to surround the PMOS transistor portion, and n⁺ layer 9 serving as a channel cut layer (implantation layer for element isolation) is formed immediately under the isolation oxide film.

Figure 8:
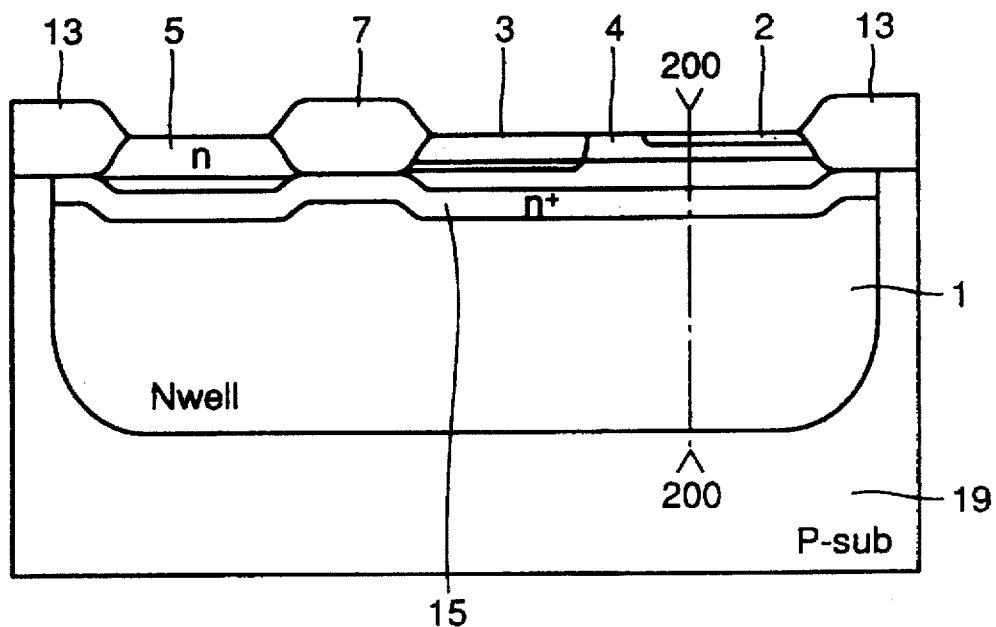
FIG. 8 is a cross sectional view showing a semiconductor device in accordance with a second embodiment of the present invention.

Referring to FIG. 8, the positions of external base layer 3 and the emitter layer are reversed in this second embodiment as compared with the first embodiment shown in FIG. 1. When emitter layer 2 is located on the right side of intrinsic base layer 4 as shown, the distance between emitter layer 2 and collector extraction layer 5 is longer. In such a case, if n⁺ layer 6 is provided only under isolation oxide film 7 as in the embodiment shown in FIG. 1, reduction in collector resistance would be insufficient.

More specifically, n well 1 positioned under intrinsic base layer 4 also serves as collector resistor in the structure shown in FIG. 8, creating the need to reduce resistance at this portion. Therefore, in this second embodiment, an n layer 15 is provided at a prescribed depth from intrinsic base layer 4, extending approximately in parallel to base layer 4. This layer 15 is formed so that the depth thereof from the surface of the substrate is less at the portion located under isolation oxide film 7 than the other portions. By thus providing n layer 15 under intrinsic base layer 4 as well, collector resistance can be efficiently reduced even when the distance between emitter layer 2 and collector extraction layer 5 is greater than the width of isolation oxide film 7.

Figure 9:
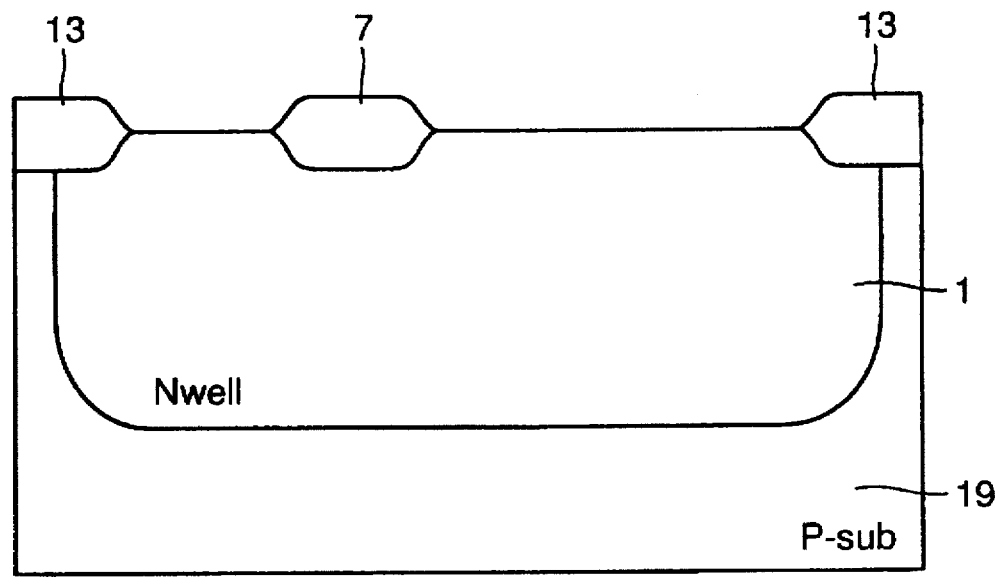
FIGS. 9 and 10 are cross sectional views showing first and second steps, respectively, of processes for manufacturing the semiconductor device in FIG. 8 in accordance with the second embodiment.
Figure 10:
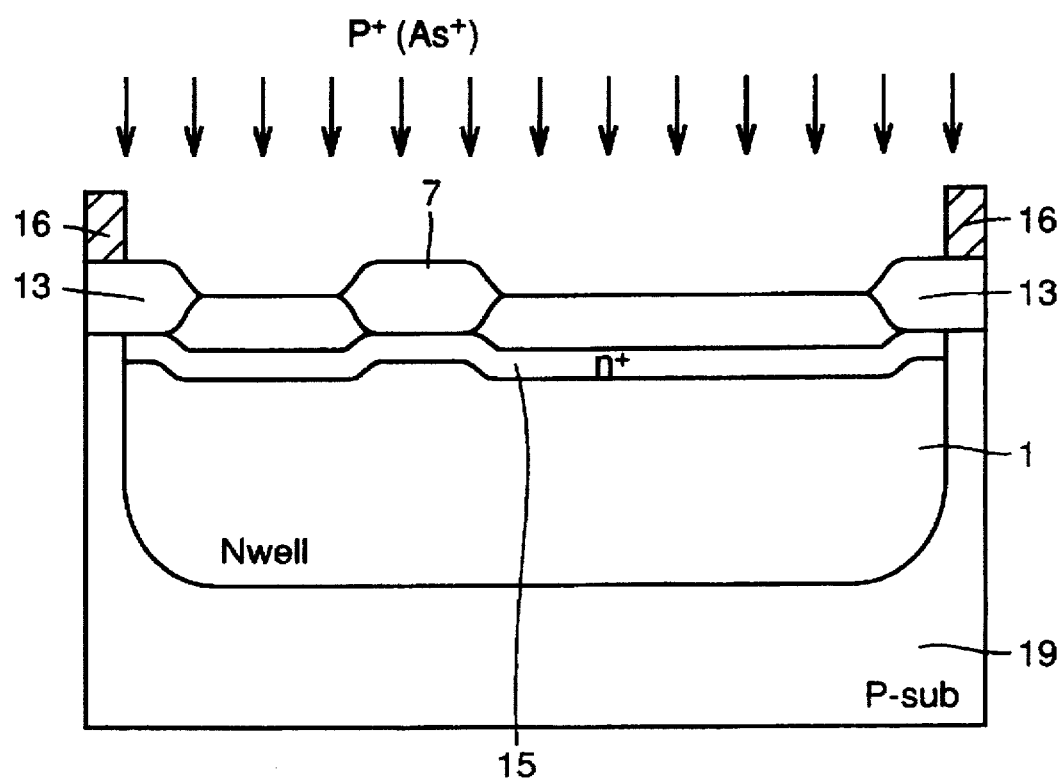

Next, a method of forming n⁺ layer 15 will be described with reference to FIGS. 9 and 10. Referring to FIG. 9, n well 1 is formed at the main surface of p type semiconductor substrate 19 by thermal diffusion or ion implantation. Isolation oxide films 7 and 13 are formed at prescribed regions of the main surface of n well 1 with a prescribed distance therebetween. A resist pattern 16 is then formed by photolithography to cover a region other than a region for a bipolar transistor. Using resist pattern 16 as a mask, ions of phosphorus are implanted with 200–600 keV and $1 \times 10^{12} - 1 \times 10^{14}/cm^2$. Arsenic can also be implanted instead of phosphorus, and in that case, ions thereof are implanted with 600–1200 keV and $1 \times 10^{12} - 1 \times 10^{14}/cm^2$. This completes n⁺ layer 15 having an impurity profile as shown in FIG. 10.

The impurity concentration of n layer 15 is higher than that of n well 1. Resist pattern 16 is then removed. Intrinsic base layer 4, external base layer 3, emitter layer 2 and collector extraction layer 5 as shown in FIG. 8 are formed by conventional methods. As described above, in the second embodiment, collector resistance can be reduced from several kilo-ohms to hundred ohms even if emitter layer 2 and collector extraction layer 5 are distant because n⁺ layer 15 serves as a current path. By forming n⁺ layer 15 as described above, n type impurity concentration increases at the base portion of a parasitic p-n-p bipolar transistor having external base layer 3 as an emitter, n well 1 as a base, and p type substrate 19 as a collector, thereby reducing current amplification ratio of the parasitic p-n-p bipolar transistor.

Figure 11:
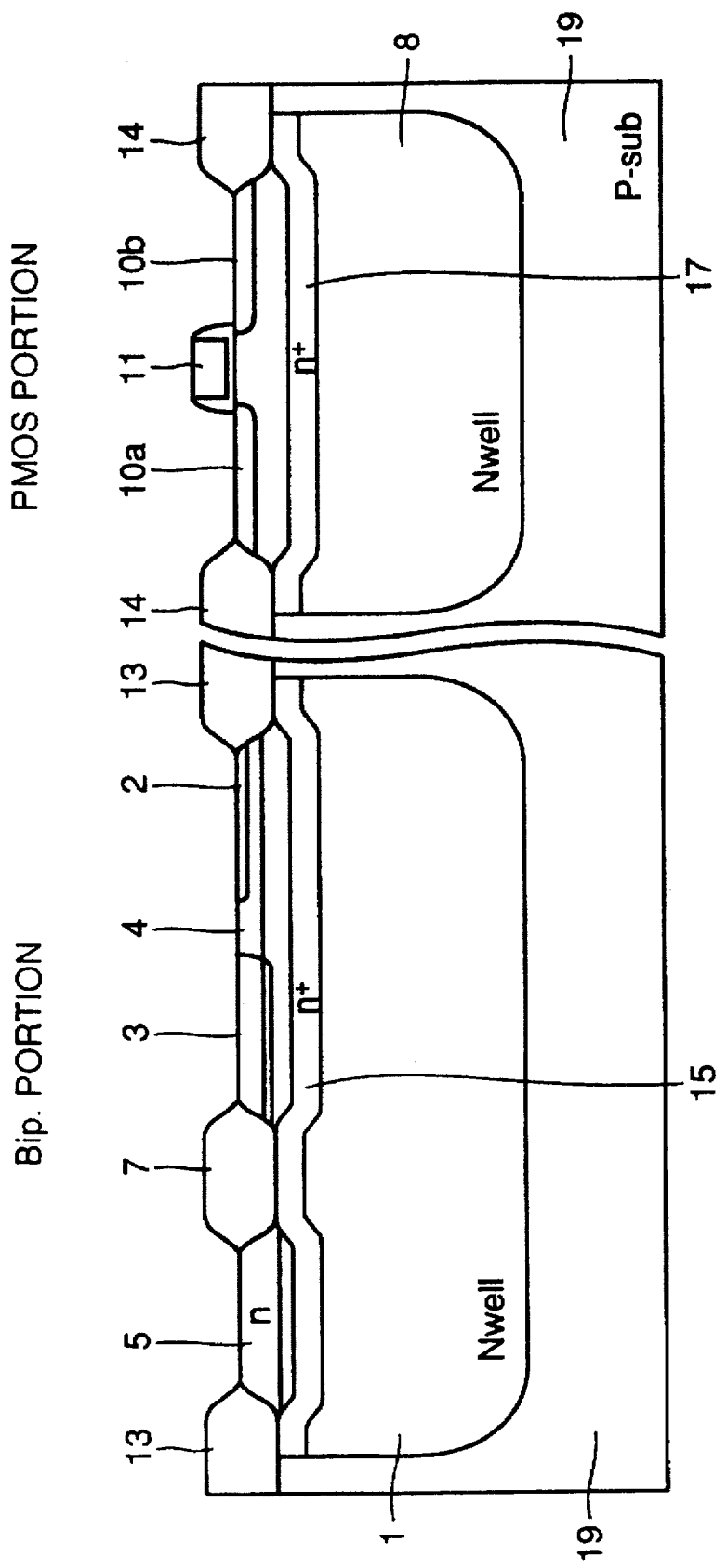
FIG. 11 is a cross sectional view showing an application of the semiconductor device in FIG. 8 in accordance with the second embodiment.

Referring to FIG. 11, in an application of the second embodiment, an n⁺ layer 17 is formed at the PMOS transistor portion when $n^+$ layer 15 is formed at the bipolar transistor portion. The $n^+$ layer 17 in the PMOS transistor portion serves as a channel cut layer (implantation layer for element isolation) of the PMOS transistor. More specifically, in this application $n^+$ layer 17 serving as a channel cut layer (implantation layer for element isolation) of the PMOS transistor portion is formed at the same time as $n^+$ layer 15 for reducing collector resistance at the bipolar transistor portion, thereby efficiently reducing collector resistance without increasing the number of manufacturing steps.

Figure 12:
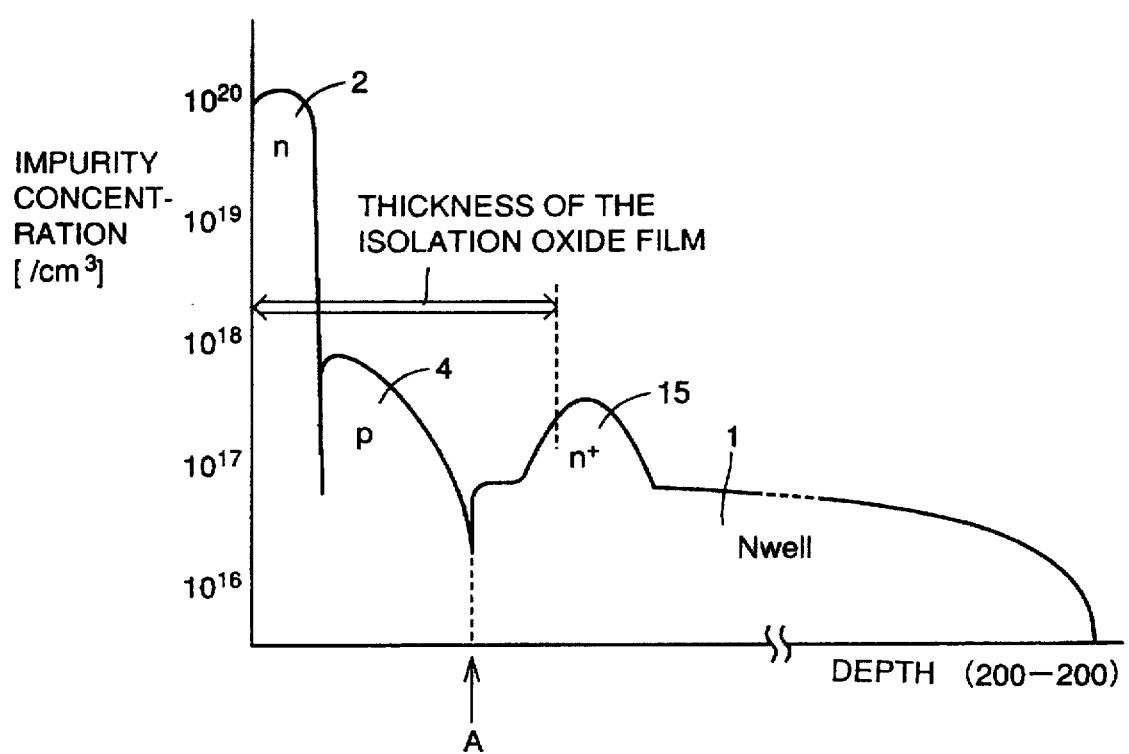
FIG. 12 shows an impurity profile along the line 200—200 of the semiconductor device in FIG. 8 in accordance with the second embodiment.

In the manufacturing methods in accordance with the second embodiment and the application thereof, ion implantation is performed for forming $n^+$ layers 15 and 17 through isolation oxide films 7, 13 and 14. As a result, the depth of the $n^+$ layer immediately under intrinsic base layer 4 and emitter layer 2 from the substrate surface is approximately equal to the thickness of isolation oxide films 7 and 13. If the depth of the junction between intrinsic base layer 4 and n well 1 from the substrate surface exceeds the thickness of the isolation oxide films, the junction is brought into contact with $n^+$ layer 15. This will give rise a problem of generating a punch-through breakdown of the bipolar transistor. Therefore, in the structures of the second embodiment and the application thereof, the junction position A between intrinsic base layer 4 and n well 1 must not overlap $n^+$ layer 15 as shown in FIG. 12. Thus, the depth of junction position A between the base and the collector from the surface of the substrate need to be less than the thickness of isolation oxide film 7, so that a punch-through breakdown of a bipolar transistor is not generated even if $n^+$ layer 15 is provided for reducing collector resistance in the second embodiment and the application thereof.

Figure 28:
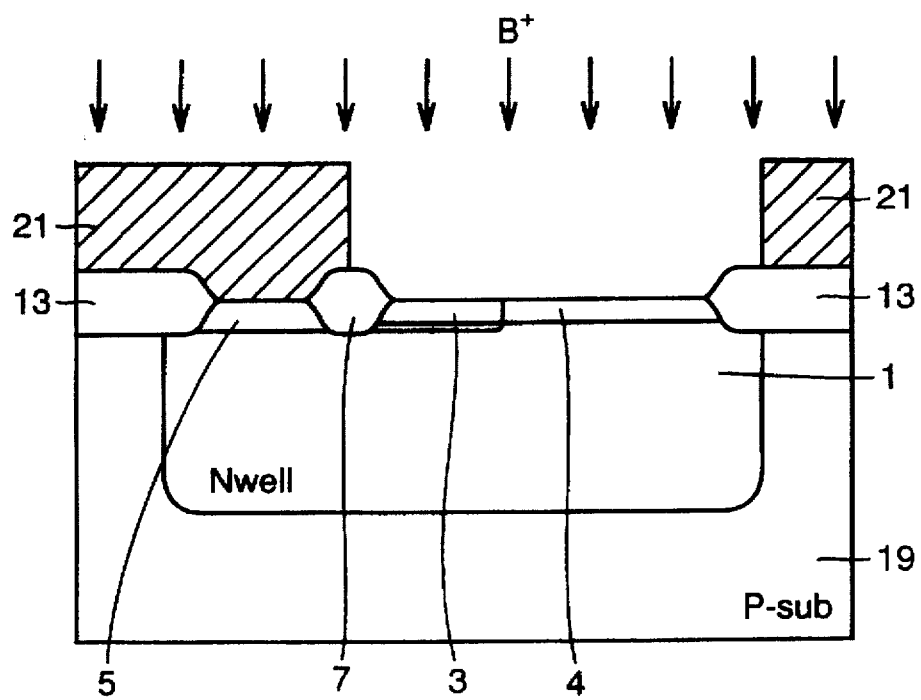
Figure 29:
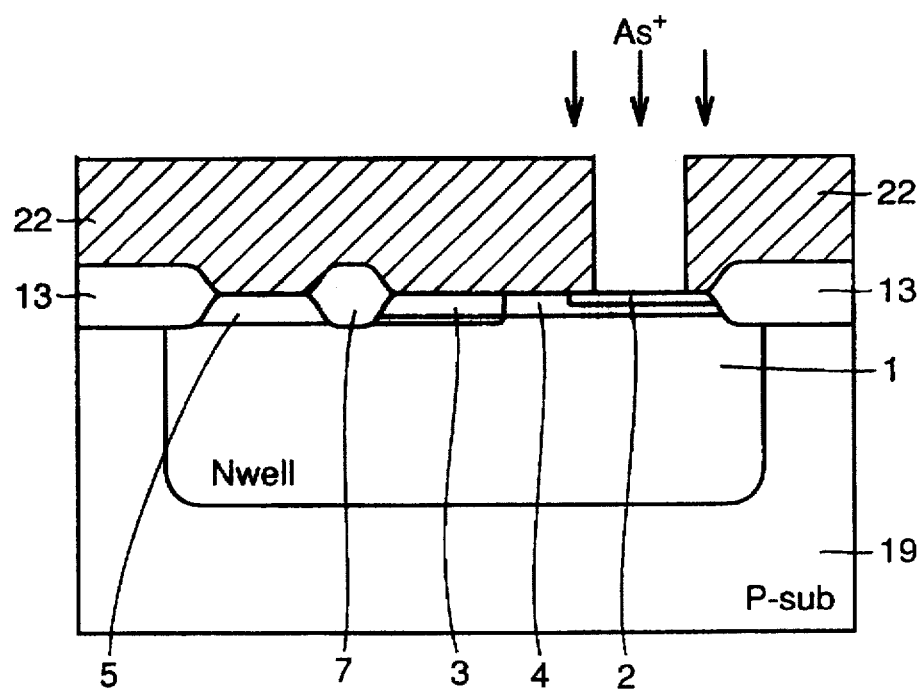
Figure 30:
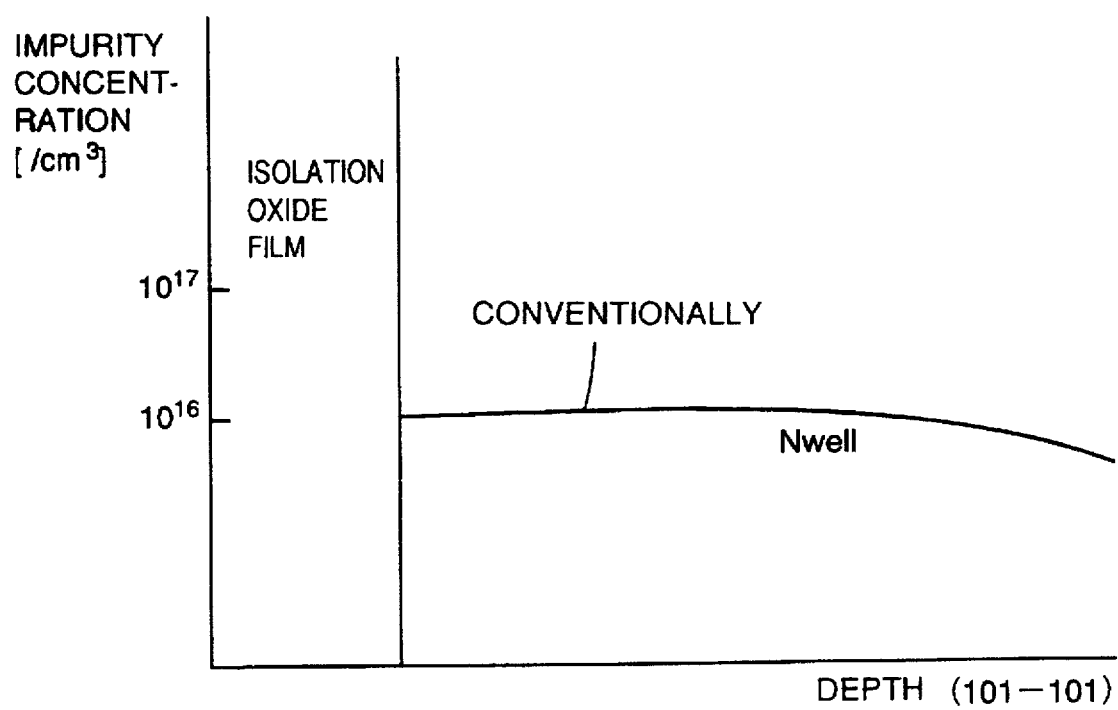
FIG. 30 shows an impurity profile along the line 101—101 of the conventional semiconductor device shown in FIG. 23.

Next, processes for manufacturing a semiconductor device in accordance with a third embodiment of the present invention will be described. In the conventional manufacturing processes for a semiconductor device, ions of boron (B) are implanted for forming intrinsic base layer 4 as shown in FIG. 28. Since boron is a light element and thus has a long projected range, it is hard to obtain a shallow profile thereof. The effect of channeling also makes it difficult to obtain a shallow profile. Therefore, it has been difficult to form a shallow intrinsic base layer 4 by the conventional manufacturing method, and thus difficult to make the junction depth of intrinsic base layer 4 less than the thickness of isolation oxide film 7. In order to solve this problem, a method of forming a shallow intrinsic base layer 4 as will be described below is conceived.

Figure 13:
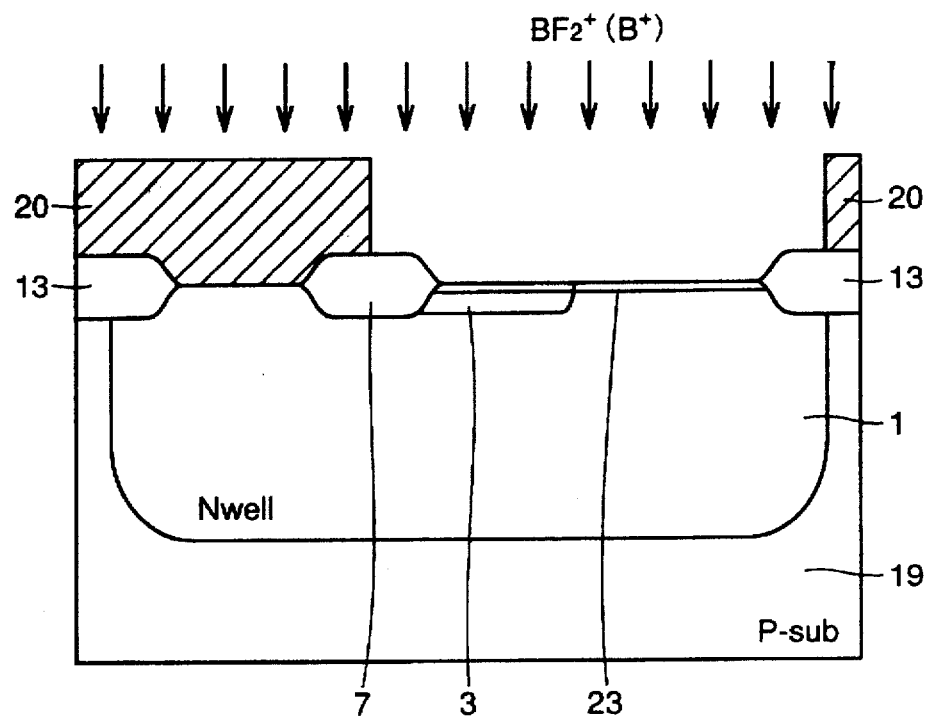
FIGS. 13–15 are cross sectional views showing first through third steps, respectively, of processes for manufacturing a semiconductor device in accordance with a third embodiment of the present invention.

In the manufacturing processes of the third embodiment, external base layer 3 is formed, and then a resist pattern 20 is formed to cover a region other than a region where an intrinsic base layer is to be formed, as shown in FIG. 13. Using resist pattern 20 and isolation oxide films 7 and 13 as a mask, $BF_2$ ions are implanted into the surface of n well 1 with $1 \times 10^{13} – 1 \times 10^{15}/cm^2$ and 20–80 keV. Boron (B) can also be implanted instead of $BF_2$. A p type region 23 is thus formed shallow so as not to influence the width of the base. Resist pattern 20 is removed thereafter.

Figure 14:
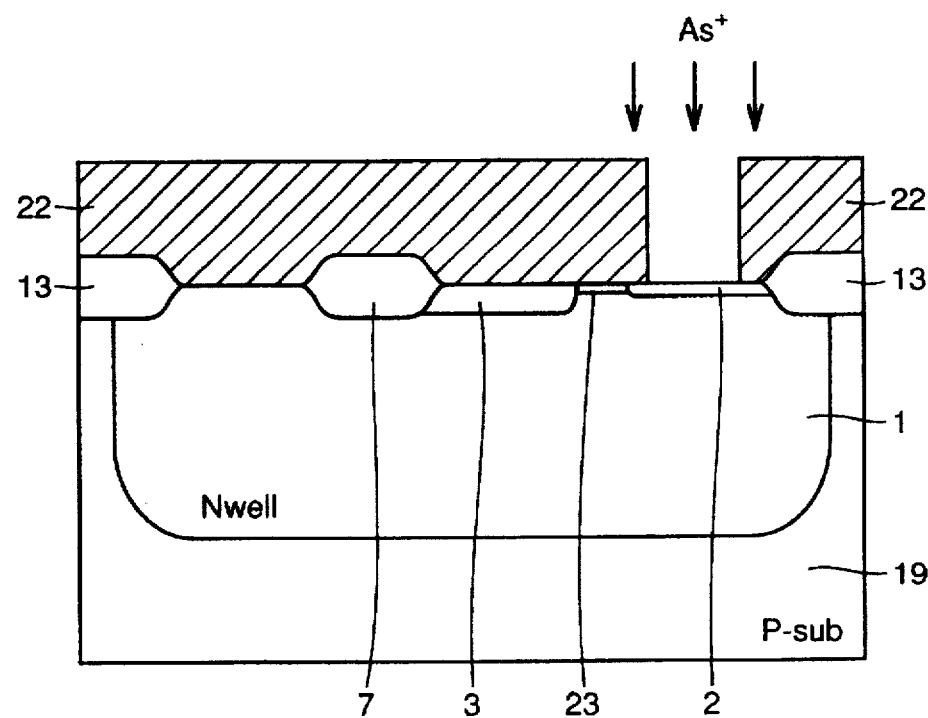
Figure 15:
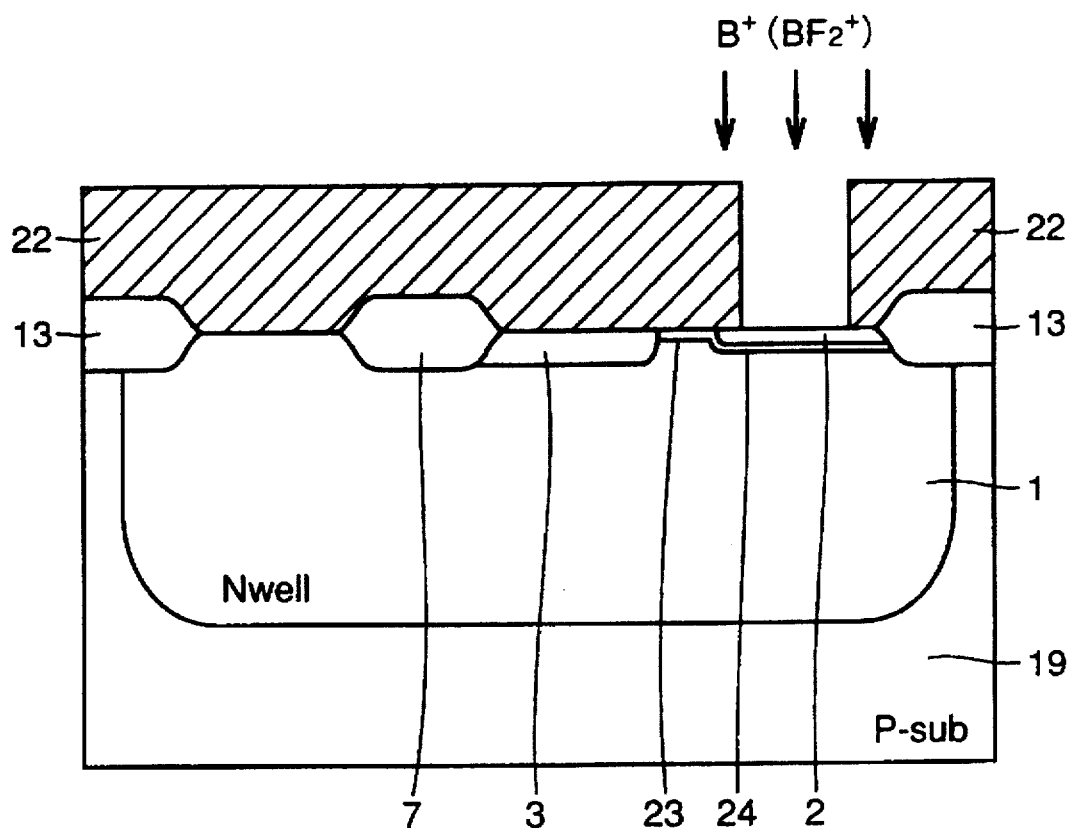

Next, as shown in FIG. 14, a resist pattern 22 is formed so as to cover a region other than a region for an emitter layer. Using resist pattern 22 as a mask, ions of arsenic (As) are implanted with $1 \times 10^{14} – 1 \times 10^{16}/cm^2$ and 20–150 keV to form emitter layer 2. Referring to FIG. 15, using as a mask the same resist pattern 22 as that for forming emitter layer 2, ions of boron (B) are implanted with $1 \times 10^{13} – 1 \times 10^{15}/cm^2$ and 10–30 keV. Ions of $BF_2$ can also be implanted instead of boron. A shallow intrinsic base layer 24 can thus be formed. Resist pattern 22 is then removed.

In accordance with the manufacturing method of the third embodiment, the surface of p type semiconductor substrate 19 is brought into an amorphous state by implanting arsenic (As) when emitter layer 2 is formed. Since ion implantation for forming intrinsic base layer 24 is performed at the now amorphous surface, intrinsic base layer 24 can be formed under no influence of channeling, and therefore a shallow intrinsic base layer 24 can be formed. In accordance with this method, a shallow intrinsic base layer 24 can be formed even with greater implantation energy of boron for forming layer 24. Although p type region 23 is formed before formation of emitter layer 2 in the manufacturing method of the third embodiment, p type region 23 can be formed after emitter layer 2 or intrinsic base layer 24 is formed.

Figure 16:
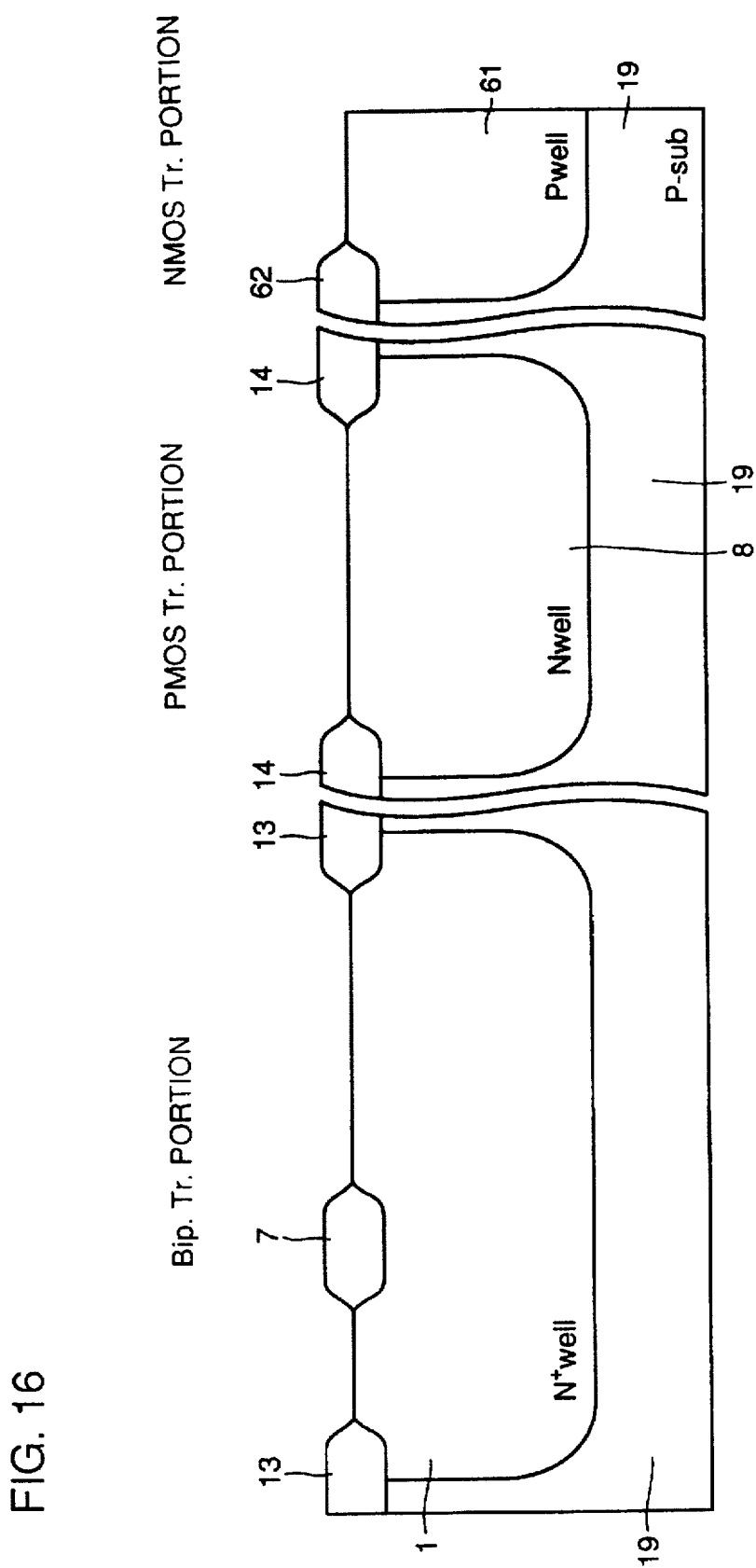
FIG. 16 is a cross sectional view showing a semiconductor device in accordance with a fourth embodiment of the present invention.

Referring to FIG. 16, in a semiconductor device in accordance with a fourth embodiment, the impurity concentration of n well 1 in the bipolar transistor portion is set higher than that of n well 8 in the PMOS transistor portion. Collector resistance can be reduced also by thus setting higher the impurity concentration of n well 1 in the bipolar transistor portion. Although collector resistance is reduced by providing $n^+$ layers 6 and 15 in the first and second embodiments, this reduction in collector resistance is achieved by setting higher the impurity concentration of n well 1 in the fourth embodiment. Since conventionally n wells 8 and 1 have been formed simultaneously in the PMOS transistor portion and the bipolar transistor portion respectively, it has been difficult to obtain a high concentration only at n well 1 of the bipolar transistor portion. In this embodiment, however, it is easy to obtain a high impurity concentration only at n well 1 of the bipolar transistor portion by utilizing the manufacturing processes described later. As a result, collector resistance of the bipolar transistor can be reduced without causing a decline in performance of the PMOS transistor portion.

Figure 17:
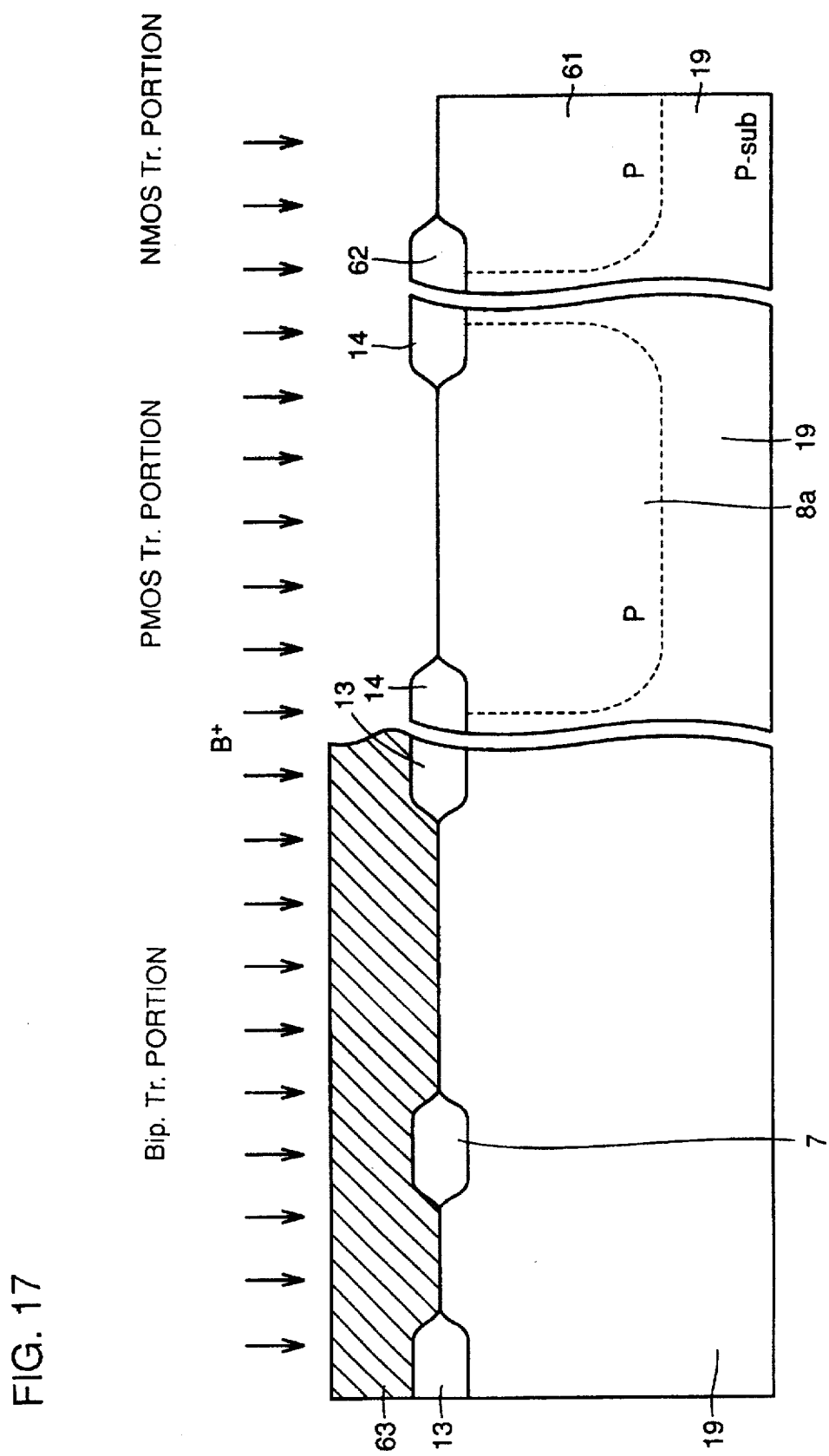
FIGS. 17 and 18 are cross sectional views showing first and second steps, respectively, of processes for manufacturing the semiconductor device in FIG. 16 in accordance with the fourth embodiment.
Figure 18:
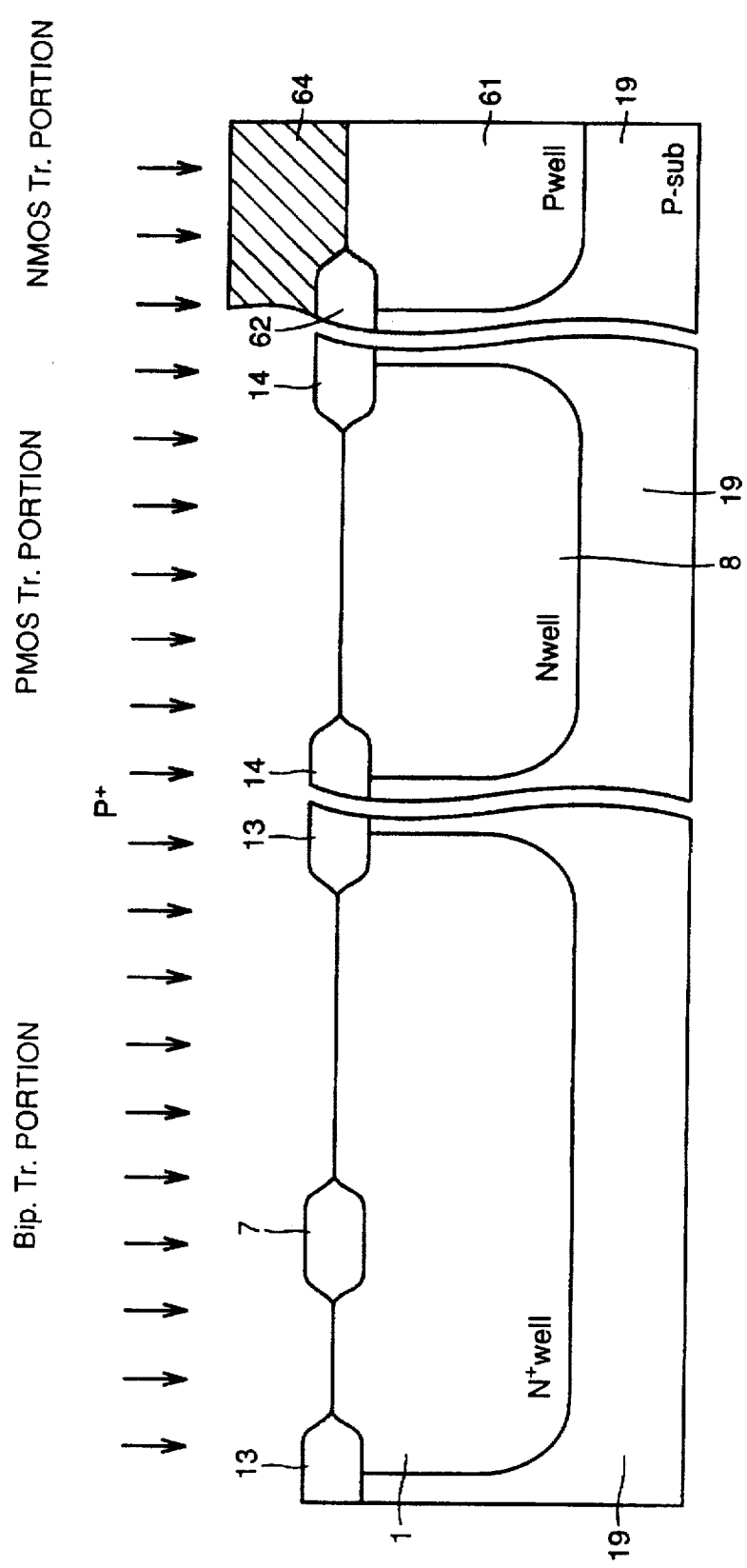
Figure 19:
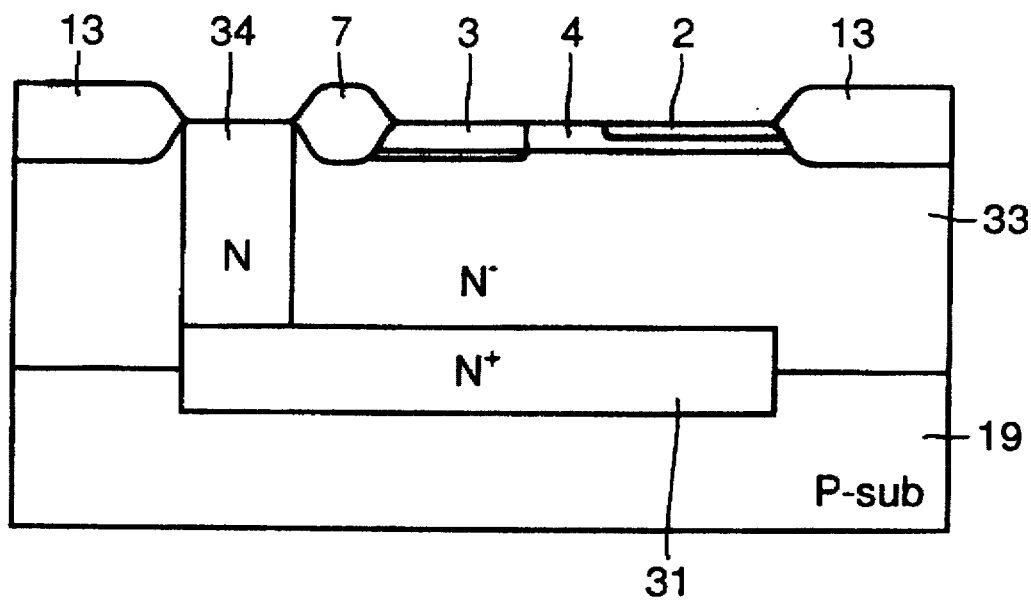
FIG. 19 is a cross sectional view showing an example of a conventional semiconductor device.
Figure 20:
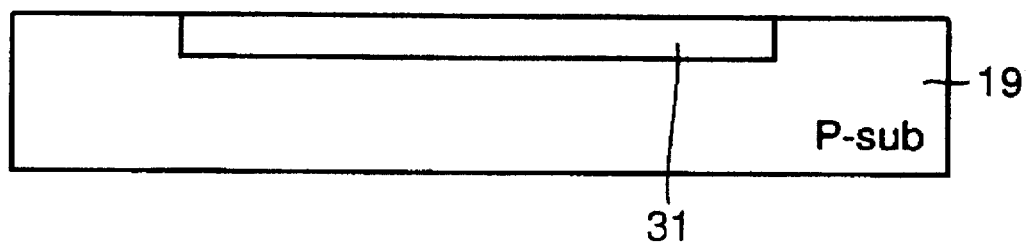
FIGS. 20–22 are cross sectional views showing first through third steps, respectively, of processes for manufacturing the conventional semiconductor device shown in FIG. 19.
Figure 21:
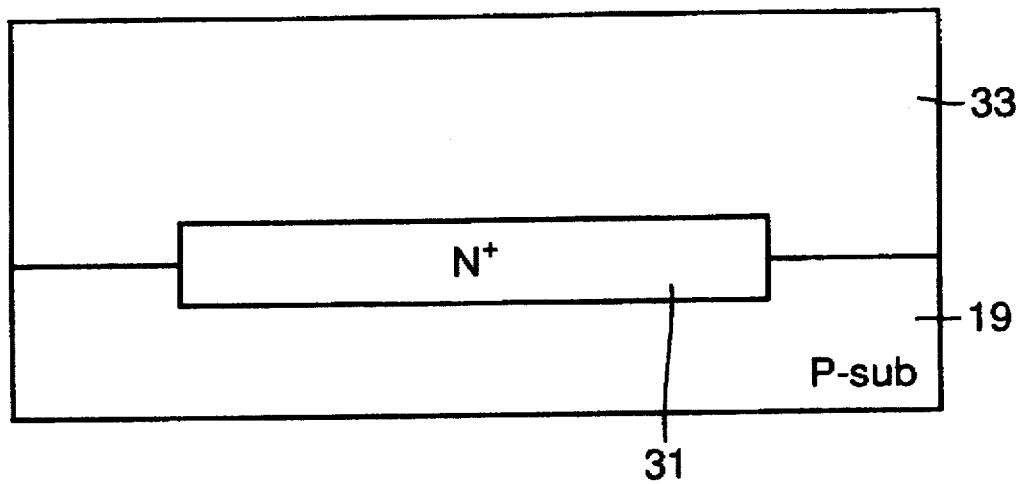
Figure 22:
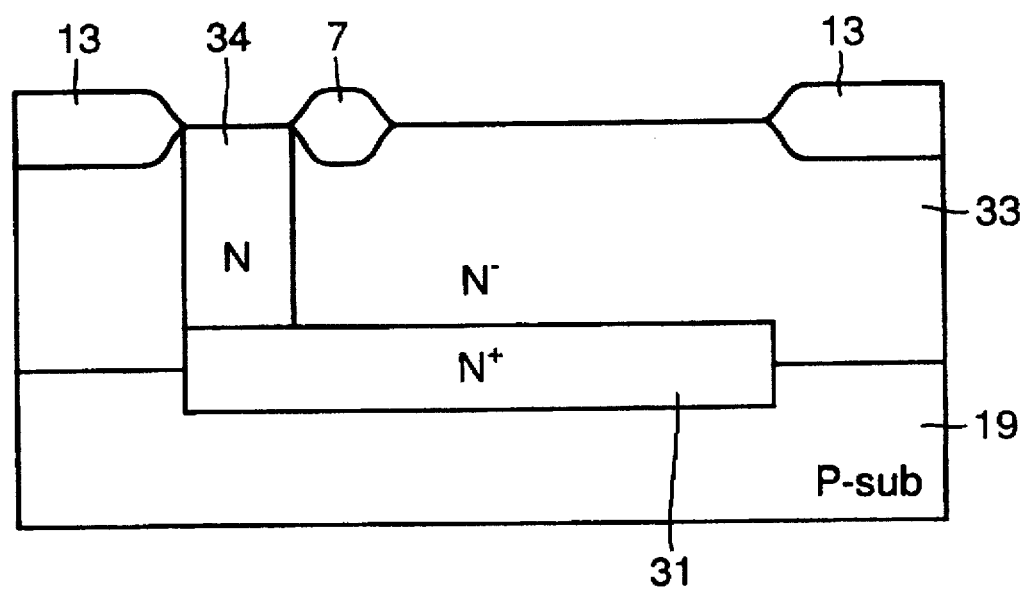
Figure 23:
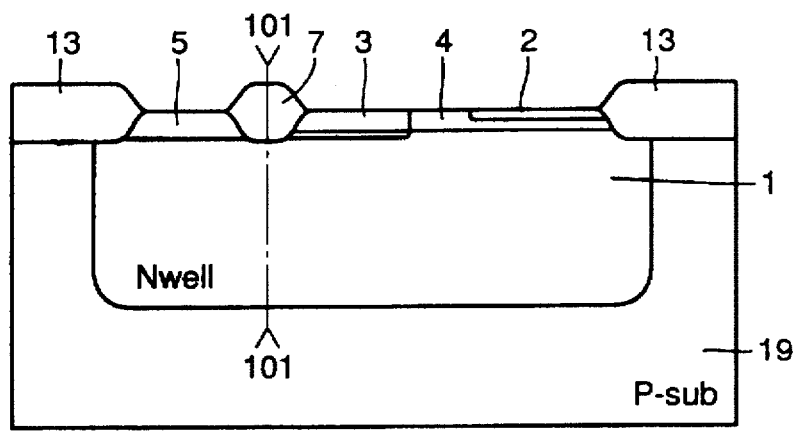
FIG. 23 is a cross sectional view showing another example of a conventional semiconductor device.
Figure 24:
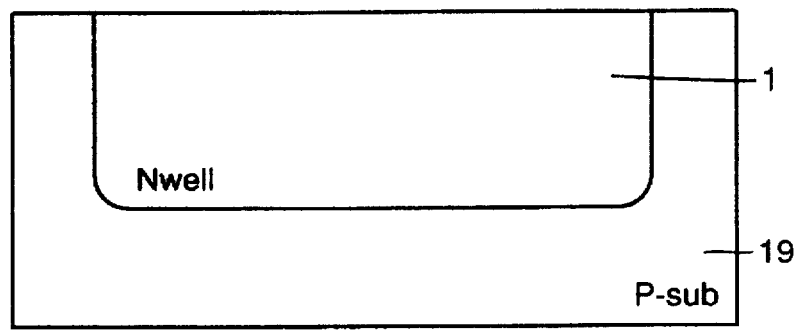
FIGS. 24–29 are cross sectional views showing first through sixth steps, respectively, of processes for manufacturing the conventional semiconductor device shown in FIG. 23.
Figure 25:
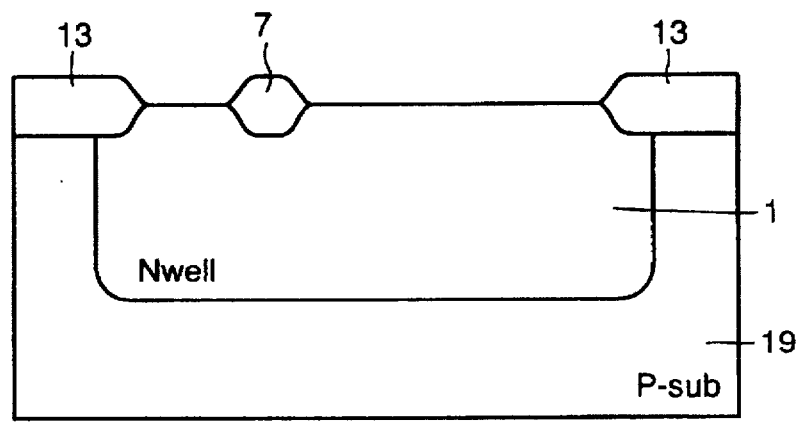
Figure 26:
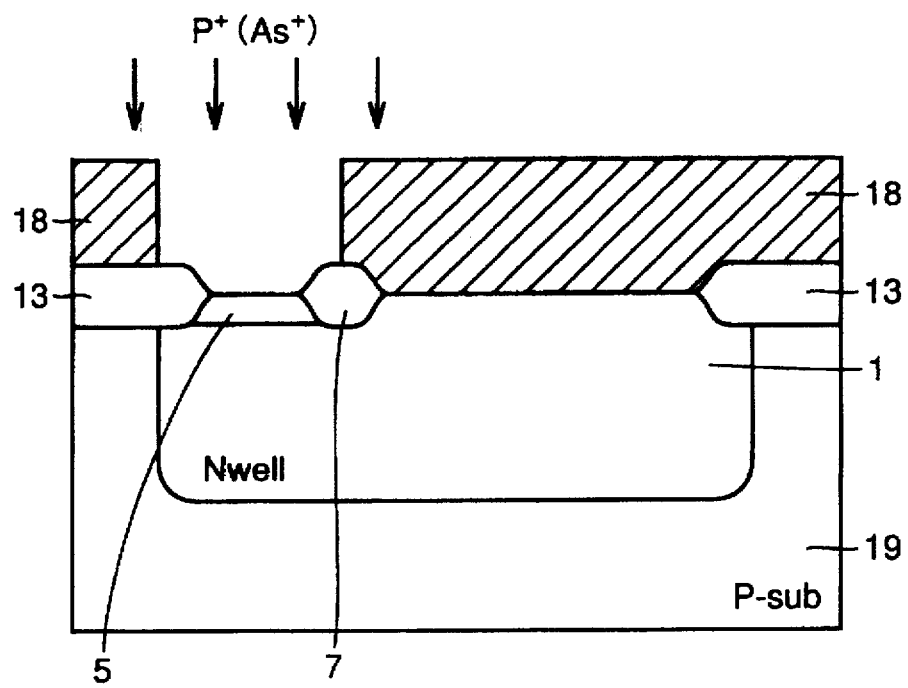
Figure 27:
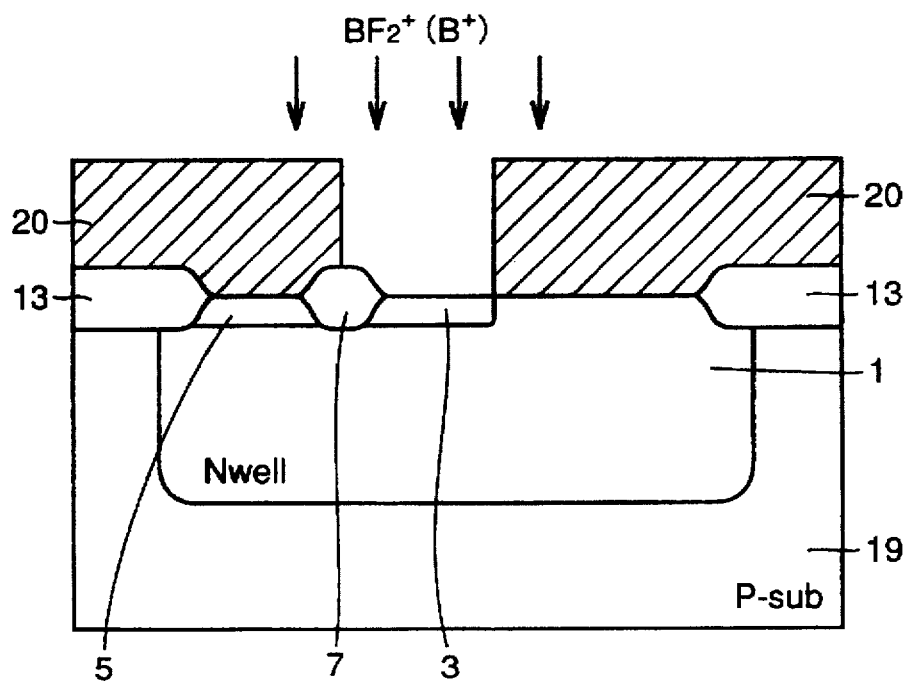

Referring to FIGS. 17 and 18, processes for manufacturing a semiconductor device in accordance with the fourth embodiment will be described. Referring to FIG. 17, isolation oxide films 7, 13, 14 and 62 are formed at prescribed regions at the main surface of p type semiconductor substrate 19. A resist pattern 63 is formed covering a portion for forming a bipolar transistor and exposing portions for a PMOS transistor and an NMOS transistor. Using resist pattern 63 as a mask, ions of boron (B) are implanted with $1 \times 10^{12}/cm^2 – 1 \times 10^{14}/cm^2$. A p well 61 is thus formed at the NMOS transistor portion, and a p type impurity region 8a is formed at the PMOS transistor portion. Resist pattern 63 is removed thereafter.

As shown in FIG. 18, a resist pattern 64 is formed to cover the NMOS transistor portion. By using resist pattern 64 as a mask, ions of phosphorus (P) are implanted to the portions where a bipolar transistor and a PMOS transistor are to be formed with $2 \times 10^{12}/cm^2 – 2 \times 10^{14}/cm^2$. By performing heat treatment for about 0.5–10 hours under the temperature of 1000° C.–1200° C., the implanted impurity is activated. As a result, n well 1 is formed in the bipolar transistor portion having a impurity concentration higher than that of n well 8 in the PMOS transistor portion.

More specifically, in the manufacturing method of the fourth embodiment, boron (B), p type impurity, is implanted in the PMOS transistor portion before n type phosphorus (P) is implanted in the same region, so that the high concentration of phosphorus is somewhat reduced by an offset against boron. As a result, the impurity concentration of n well 8 formed in the PMOS transistor portion is lower than that of n well 1 formed in the bipolar transistor portion. Meanwhile, only high impurity concentration phosphorus, which is n type impurity, is implanted into the bipolar transistor portion, so that the impurity concentration of n well 1 formed in the bipolar transistor portion can be made higher. Such manufacturing method makes it possible to obtain a high impurity concentration only at n well 1 in the bipolar transistor portion. As a result, collector resistance of the bipolar transistor can be reduced without a degradation in performance of the PMOS transistor.

Although a well region is formed by ion implantation and heat treatment in the manufacturing method of the fourth embodiment, a well region can be formed solely by ion implantation (so-called retrograde-well).

Although the applications for an n-p-n bipolar transistor formed in n well 1 have been described in the first through fourth embodiments above, the present invention is not limited thereto, and it can be similarly applied to a structure having a p-n-p bipolar transistor formed in a p well and a structure having a p-n-p bipolar transistor and an NMOS transistor. In that case, p layers are formed in place of $n^+$ layers 6 and 15 in the first and second embodiments.

As described above, in a semiconductor device in accordance with one aspect of the present invention, a first impurity layer of a first conductivity type which has an impurity concentration higher than that of a first semiconductor region is formed in a manner that substantially all the upper portion thereof is in contact with a lower surface of an element isolation insulating film formed between a base layer and a collector extraction layer, thereby easily reducing collector resistance of a bipolar transistor. Since the first impurity layer can be easily formed by ion implantation, the present invention allows reduction in collector resistance without complicating the manufacturing processes. If the semiconductor device further includes a second impurity layer of the first conductivity type serving as a channel cut layer of a field effect transistor of a second conductivity type, the first impurity layer can be formed simultaneously with the second impurity layer. As a result, collector resistance can be reduced without increasing the manufacturing processes.

In a semiconductor device in accordance with another aspect of the present invention, a first impurity layer of a first conductivity type having a impurity concentration higher than that of the first semiconductor region is provided at a prescribed depth from a lower surface of a base layer, extends substantially in parallel to the base layer and has an upper portion partially in contact with a lower surface of a first element isolation insulating film. Consequently the first impurity layer serves as a current path even if an emitter layer and a collector extraction layer are distant, and therefore collector resistance can be efficiently reduced. Since the first impurity layer can be easily formed by ion implantation method or the like, a semiconductor device having a reduced collector resistance can be easily manufactured without complicating the manufacturing processes. If the semiconductor device further includes a second impurity layer of the first conductivity type serving as a channel cut layer at a region where a field effect transistor is formed, the first impurity layer is formed simultaneously when the second impurity layer is formed. As a result, a semiconductor device having reduced collector resistance can be formed without increasing the manufacturing processes.

In a semiconductor device in accordance with a further aspect of the present invention, the impurity concentration of a first well region where a bipolar transistor is formed is set higher than that of a second well region where a field effect transistor is formed, thereby reducing collector resistance of the bipolar transistor without degrading performance of the field effect transistor.

In a method of manufacturing a semiconductor device in accordance with a further aspect of the present invention, ions of impurity are implanted immediately under an element isolation insulating film positioned between a base layer and a collector extraction layer, so as to form a first impurity layer of a first conductivity type having a higher impurity concentration than that of a semiconductor region in a manner that substantially all the upper portion thereof is in contact with a lower surface of the element isolation oxide film. Thus, a semiconductor device having reduced collector resistance can be manufactured without complicating manufacturing processes.

In a method of manufacturing a semiconductor device in accordance with a further aspect of the present invention, ions of impurity are implanted into a semiconductor region to form a first impurity layer having a higher impurity concentration than the semiconductor region at a prescribed depth from a lower surface of a base layer, extending substantially in parallel to the base layer and having an upper portion partially in touch with a lower surface of an element isolation insulating film. As a result, a semiconductor device can be easily manufactured which allows reduction in collector resistance even when an emitter layer and a collector layer are widely separated.

In a method of manufacturing a semiconductor device in accordance with a still further aspect of the present invention, ions of impurity are implanted into a prescribed region on a main surface of a semiconductor region, bringing the main surface of the semiconductor region into an amorphous state and forming an emitter layer, and then ions of impurity are implanted into the now amorphous region to form a base layer. As a result, a base layer having a depth less than that of an element isolation insulating film from the surface of the base layer can be easily formed, thereby preventing a punch-through breakdown of a bipolar transistor when the first impurity layer is formed in accordance with the immediately above further aspect of the present invention. Since a shallow base layer is formed, characteristics of a bipolar transistor with high performance can be obtained.

In a method of manufacturing a semiconductor device in accordance with a further aspect of the present invention, ions of impurity of a second conductivity type are implanted into a region for forming a first well region where a field effect transistor of the second conductivity type is to be formed, and then ions of impurity of a first conductivity type are implanted to the first well region and a second well region where a bipolar transistor is to be formed. Consequently, the first well region of the first conductivity type and the second well region of the first conductivity type having a higher impurity concentration than the first well region can be easily formed. As a result, the impurity concentration can be made higher only at the well region where a bipolar transistor is to be formed while maintaining a normal impurity concentration at the first well region where the field effect transistor is to be formed. Accordingly, a semiconductor device having reduced collector resistance of a bipolar transistor can be easily manufactured without degrading performance of a field effect transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a first semiconductor region of a first conductivity type having a main surface;

a base layer of a second conductivity type formed at a prescribed region of the main surface of said first semiconductor region;

an emitter layer of the first conductivity type formed at a prescribed region of a main surface of said base layer;

a collector extraction layer formed with a prescribed distance from said base layer at the main surface of said first semiconductor region;

a first element isolation insulating film formed between said base layer and said collector extraction layer on the main surface of said first semiconductor region;

a first impurity layer of the first conductivity type having an upper surface and an impurity concentration higher than that of said first semiconductor region, and substantially all of said upper surface is in contact with a lower surface of said first element isolation insulating film.

2. The semiconductor device according to claim 1, wherein the impurity concentration of said first impurity layer is $10^{17}/cm^3$ or more.

3. The semiconductor device according to claim 1, wherein said base layer includes an intrinsic base layer covering said emitter layer, and an external base layer formed with a prescribed distance from said emitter layer at a main surface of said intrinsic base layer.

4. The semiconductor device according to claim 1, further comprising:

a second semiconductor region of the first conductivity type having a main surface;

a field effect transistor of the second conductivity type formed at the main surface of said second semiconductor region;

a second element isolation insulating film formed at the main surface of said second semiconductor region and surrounding said field effect transistor; and a second impurity layer of the first conductivity type serving as a channel stop layer and formed in a manner that substantially all an upper portion thereof is in contact with a lower surface of said second element isolation insulating film; wherein said first impurity layer and said second impurity layer have substantially the same impurity concentration.

5. A semiconductor device, comprising:

a first semiconductor region of a first conductivity type having a main surface;

a base layer of a second conductivity type formed at a prescribed region of the main surface of said first semiconductor region;

an emitter layer of the first conductivity type formed at a prescribed region of a main surface of said base layer;

a collector extraction layer of the first conductivity type formed with a prescribed distance from said base layer at the main surface of said first semiconductor region;

a first element isolation insulating film formed between said base layer and said collector extraction layer on the main surface of said first semiconductor region; and a first impurity layer of the first conductivity type having an impurity concentration higher than that of said first semiconductor region and formed at a prescribed depth from a lower surface of said base layer so as to extend substantially in parallel to said base layer, said first impurity layer having an upper surface and a lower surface, with a portion of its upper surface in contact with a lower surface of said first element isolation insulating film; wherein a portion of said lower surface of said first impurity layer located under said first element isolation insulating film is made shallower than other portions of the lower surface of the first impurity layer.

6. The semiconductor device according to claim 5, wherein said base layer is formed in a manner that a junction depth thereof from the main surface of said semiconductor region is less than a thickness of said first element isolation insulating film.

7. The semiconductor device according to claim 5, wherein said emitter layer is formed at an end of a main surface of said base layer opposing to an end where said first element isolation insulating film is formed.

8. A semiconductor device, comprising:

a first semiconductor region of a first conductivity type having a main surface;

a base layer of a second conductivity type formed at a prescribed region of the main surface of said first semiconductor region;

an emitter layer of the first conductivity type formed at a prescribed region of a main surface of said base layer;

a collector extraction layer of the first conductivity type formed with a prescribed distance from said base layer at the main surface of said first semiconductor region;

a first element isolation insulating film formed between said base layer and said collector extraction layer on the main surface of said first semiconductor region;

a first impurity layer of the first conductivity type having an impurity concentration higher than that of said first semiconductor region and formed at a prescribed depth from a lower surface of said base layer so as to extend substantially in parallel to said base layer and to have a part of its upper portion being in contact with a lower surface of said first element isolation insulating film; wherein a portion of said first impurity layer located under said first element isolation insulating film is made shallower than other portions of the first impurity layer;

a second semiconductor region of the first conductivity type having a main surface;

a field effect transistor of the second conductivity type formed at the main surface of said second semiconductor region;

a second element isolation insulating film formed at the main surface of said second semiconductor region and surrounding said field effect transistor; and a second impurity layer of the first conductivity type serving as a channel stop layer, having an impurity concentration higher than that of the second semiconductor region, and formed below a region where said field effect transistor is formed so as to extend substantially in parallel to the main surface of said second semiconductor region and to have a part of its upper portion being in contact with a lower surface of said second element isolation insulating film; wherein a portion of said second impurity layer located under said second element isolation insulating film is formed to be shallower than other portions of the second impurity layer.

9. A semiconductor device, comprising:

a semiconductor substrate having a main surface;

a first well region of a first conductivity type with an impurity concentration, formed directly in said semiconductor substrate and having a bipolar transistor formed on its surface;

a second well region having the first conductivity type and a second conductivity type with an impurity concentration for both the first and second conductivity types, formed directly in said semiconductor substrate and having a field effect transistor formed on its surface; and a third well region of the second conductivity type with an impurity concentration formed at a main surface of said semiconductor substrate; wherein the impurity concentration of the first conductivity in the first well region is the same as the impurity concentration of the first conductivity in the second well region and the impurity concentration of the second conductivity in the second well region is the same as the impurity concentration of the second conductivity in the third well region and the impurity concentration of the first conductivity in the first well region is higher than the impurity concentration of the second conductivity in the third well region.

* * * * *